(12) United States Patent
Ota et al.

(10) Patent No.: US 6,815,796 B2
(45) Date of Patent: Nov. 9, 2004

(54) COMPOSITE MODULE AND PROCESS OF PRODUCING SAME

(75) Inventors: Kenichi Ota, Takasaki (JP); Manabu Satomi, Gunma (JP); Masayuki Fujimoto, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 10/313,037

(22) Filed: Dec. 6, 2002

(65) Prior Publication Data

US 2003/0107060 A1 Jun. 12, 2003

(30) Foreign Application Priority Data

| Dec. 7, 2001 | (JP) | 2001-375072 |
| Mar. 28, 2002 | (JP) | 2002-091876 |
| Apr. 18, 2002 | (JP) | 2002-116487 |
| Apr. 18, 2002 | (JP) | 2002-116488 |

(51) Int. Cl.$^7$ .............................. H01L 29/00
(52) U.S. Cl. .................. 257/528; 257/531; 257/532
(58) Field of Search ................ 257/528, 531, 257/532, 643, 778

(56) References Cited

U.S. PATENT DOCUMENTS

| 6,255,714 B1 * | 7/2001 | Kossives et al. ............ 257/528 |
| 6,303,423 B1 | 10/2001 | Lin | |
| 2003/0107060 A1 * | 6/2003 | Ota et al. ................... 257/275 |

FOREIGN PATENT DOCUMENTS

JP    2001-044778    2/2001

* cited by examiner

*Primary Examiner*—Mark V. Prenty
(74) *Attorney, Agent, or Firm*—Finnegan, Henderson, Farabow, Garrett & Dunner, L.L.P.

(57) ABSTRACT

A composite module and its production process which allow multiple functions, miniaturization, low power consumption and low costs without requiring any external chip parts at all. A high-frequency integrated circuit is embedded in a silicon substrate, a high-frequency high-capacity bypass capacitor and a matching coil using thin films of different types of materials are also formed on the silicon substrate, a high-frequency high-capacity bypass capacitor is further formed with an interlayer insulation film between them, and these elements and the high-frequency integrated circuit are connected via a wiring layer.

21 Claims, 32 Drawing Sheets

DISTANCE BETWEEN
INDUCTOR AND MAGNETIC FILM

—·— : RESONANT FREQUENCY
——— : INDUCTANCE (L)
········ : LOSS

DISTANCE BETWEEN MAGNETIC FILM
AND ELECTRODE JUST BELOW IT

—·— : RESONANT FREQUENCY
········ : LOSS

COMPOSITE MODULE AND PROCESS OF PRODUCING SAME

BACKGROUND OF THE INVENTION

1. Field of the Invention

The present invention relates to a composite module such as a high frequency module and its production process, and more particularly to a composite module which can be made multifunctional and compact without requiring any external chip part and to its production process.

2. Description of the Related Art

Recently, the radio communication technology for portable telephones and the like has become indispensable to our life.

Under such circumstances, mobile communication portable terminals are demanded to be multifunctional, compact and low in power consumption, and a main component high-frequency module is also demanded to have a higher frequency, a reduced size with lower height, lower power consumption and a lower cost.

A conventional high-frequency module of this kind has active and passive components mounted on an alumina or resin substrate.

Meanwhile, approaches using an LTCC (Low Temperature Co-fired Ceramic) which can incorporate passive elements into a substrate itself, an MMIC (Microwave Monolithic Integrated Circuit) which incorporates passive parts onto an active element substrate, and an SOC (System On Chip) which has analog and digital circuits including a high-frequency circuit configured on a single chip without discriminating between them have been tried in recent years.

But, the LTCC has problems in wiring and precision of a built-in passive element, and the MMIC and the SOC have problems of a drop in yield, a cost rise, and a difficulty in production of a high-quality compact passive element due to a complex production process.

They all have to depend on a chip part for a passive element with a large element value.

SUMMARY OF THE INVENTION

Accordingly, it is an object of the present invention to provide a composite module, which is multifunctional, compact, low in power consumption, and low in cost, and a production process thereof.

It is also an object of the present invention to provide a composite module, which has an inductor and a capacitor formed on the same substrate and can be used for a high-frequency module such as a power amplifier, and a production process thereof In order to achieve the above objects, a composite module of the present invention comprises a substrate; a capacitor which is formed by stacking thin films of different types of materials on the substrate; a first wiring layer which is formed on the capacitor; a first interlayer insulation film which is formed on the first wiring layer; a magnetic film which is formed on the first interlayer insulation film; a second interlayer insulation film which is formed on the magnetic film; a first inductor pattern which is formed on the second interlayer insulation film; a third interlayer insulation film which is formed on the second interlayer insulation film; a second inductor pattern which is formed on the third interlayer insulation film to partly overlap with the first inductor pattern; a second wiring layer which is formed on the third interlayer insulation film; and a high-frequency integrated circuit which is connected to the first wiring layer and to the second wiring layer and mounted on the substrate.

The capacitor is formed of an MIM capacitor having a Pt/SrTiO$_3$/Pt structure and functions as a high-frequency high-capacity bypass capacitor.

And, the capacitor is formed of an MIM capacitor having SiO$_2$ as a dielectric substance and functions as a matching low-capacity capacitor.

The first inductor pattern and the second inductor pattern are formed to partly overlap with the magnetic film to configure a two-layered magnetic thin film loaded inductor which confines magnetic flux by the magnetic film and functions as a high-frequency choke coil.

A distance between the first inductor pattern and the magnetic film is determined by a thickness of the second interlayer insulation film, and a distance between the second inductor pattern and the first inductor pattern is determined by a thickness of the third interlayer insulation film.

In the above configuration, the magnetic film is made of a nanogranular magnetic thin film.

The magnetic thin film loaded inductor is formed at a position different from the capacitor, and the first wiring layer is removed at the position where the magnetic thin film loaded inductor is formed.

The magnetic thin film loaded inductor is stacked on the capacitor.

And, the capacitor includes a high-frequency high-capacity bypass capacitor configuring a bias section and a matching capacitor configuring a high frequency section; the magnetic film, the first inductor pattern and the second inductor pattern function as a magnetic thin film loaded inductor which configures the bias section; a matching inductor which configures a high frequency section is further formed on the substrate; and the bias section including the high frequency high-capacity bypass capacitor and the magnetic thin film loaded inductor and the high-frequency section including the matching capacitor and the matching inductor are disposed on the substrate with their positions displaced from each other.

The substrate is made of a high-resistance silicon substrate.

The first to third interlayer insulation films are made of polyimide and have a total thickness of 15 µm or more.

The high-frequency integrated circuit is made of a GaAs MMIC (Microwave Monolithic Integrated Circuit), and the GaAs MMIC configures an active element of a power amplifier.

The substrate has a counter sunk portion, and the high-frequency integrated circuit is mounted in the counter sunk portion.

The high-frequency integrated circuit is connected to the second wiring layer via a bonding wire.

The high-frequency integrated circuit is connected to the second wiring layer via through holes formed in the first to third interlayer insulation films.

The high-frequency integrated circuit is connected as a flip chip type to the second wiring layer.

A process of producing a composite module of the present invention comprises a first step of forming a capacitor by stacking different types of materials on a substrate; a second step of forming a first wiring layer on the capacitor; a third step of forming a first interlayer insulation film on the first wiring layer; a fourth step of forming a magnetic thin film loaded inductor on the first interlayer insulation film; a fifth step of forming a second wiring layer on the magnetic thin film loaded inductor; and a sixth step of mounting a high-frequency integrated circuit, which is connected to the first wiring layer and to the second wiring layer, on the substrate.

Here, the first step includes a step of forming an MIM capacitor having a Pt/SrTiO$_3$/Pt structure which functions as a high-frequency high-capacity bypass capacitor.

The first step includes a step of forming an MIM capacitor having SiO$_2$, which functions as a matching low-capacity capacitor, as a dielectric substance.

The fourth step includes a step of forming a magnetic film on the first interlayer insulation film; a step of forming a second interlayer insulation film on the first interlayer insulation film including the magnetic film; a step of forming a first inductor pattern on the second interlayer insulation film to partly overlap with the magnetic film; a step of forming a third interlayer insulation film on the second interlayer insulation film including the first inductor pattern; and a step of forming a second inductor pattern on the third interlayer insulation film to partly overlap with the first inductor pattern.

The magnetic thin film loaded inductor functions as a high-frequency choke coil.

A distance between the first inductor pattern and the magnetic film is determined by a thickness of the second interlayer insulation film, and a distance between the second inductor pattern and the first inductor pattern is determined by a thickness of the third interlayer insulation film.

The magnetic film is formed of a nanogranular magnetic thin film.

The magnetic thin film loaded inductor is formed at a position different from the capacitor, and the first wiring layer is removed at a position where the magnetic thin film loaded inductor is formed.

The magnetic thin film loaded inductor is formed to overlap with the capacitor.

The substrate is formed of a high resistance silicon substrate, and the first step includes a step of forming an SiO$_2$ film on the high resistance silicon substrate.

The first to third interlayer insulation films are made of polyimide and have a total thickness of 15 $\mu$m or more.

The high-frequency integrated circuit is made of GaAs NMIC, and the GaAs MMIC configures an active element of a power amplifier.

The sixth step includes a step of forming a counter sunk portion on the substrate; and a step of mounting the high-frequency integrated circuit in the counter sunk portion formed on the substrate.

The sixth step includes a step of connecting the high-frequency integrated circuit to the second wiring layer via a bonding wire.

The sixth step includes a step of connecting the high-frequency integrated circuit to the second wiring layer via through holes formed in the first to third interlayer insulation films.

The sixth step includes a step of connecting the high-frequency integrated circuit as a flip chip type to the second wiring layer.

By configuring as described above, parts such as a high-capacity capacitor and a high-Q filter which were conventionally connected externally can be integrated. Thus, a high-frequency module and a process of producing it which allow multiple functions, miniaturization, low power consumption and low cost can be provided.

And the composite module of the present invention is a composite module having a capacitor, which is formed by stacking a first electrode layer, a dielectric layer and a second electrode layer, and a magnetic film loaded inductor provided with a magnetic film made of a magnetic material mounted on a semiconductor substrate, wherein the magnetic film loaded inductor is disposed on the capacitor at a position different from the capacitor with respect to the plane of the semiconductor substrate.

By configuring as described above, the capacitor and the inductor are disposed at different positions to the plane of the semiconductor substrate, so that the composite module can be configured to be thin, and a distance between the capacitor and the inductor can be made large.

The magnetic film loaded inductor is provided with a coil pattern made of a conductor; and a magnetic film made of a magnetic material which is disposed below, above or both sides of the coil pattern with an interlayer insulation film therebetween and in the proximity of the coil pattern; and a distance between the coil pattern and the magnetic film can be controlled accurately by accurately controlling a thickness of the interlayer insulation film when it is formed.

The magnetic film is disposed on an interlayer insulation film which has a thickness to provide an appropriate distance between the magnetic film and the semiconductor substrate. Thus, the distance between the magnetic film and the semiconductor substrate is kept to an appropriate level by the thickness of the interlayer insulation film.

The coil pattern is made of a coil pattern having a multilayer structure formed by stacking multiple coil patterns. Thus, the inductor having a large inductance value can be formed.

The semiconductor substrate has a first wiring layer on it, and the first wiring layer is formed by removing the magnetic film and the lower position of the coil pattern. Thus, the distance between the magnetic film and the semiconductor substrate becomes a distance between the magnetic film and the conductive material positioned just below the magnetic film, and the composite module can be made thin.

And, a process of producing a composite module according to the present invention comprises a step of forming a first insulation layer on the surface of a semiconductor substrate; a step of forming a capacitor by stacking a lower electrode, a dielectric film and an upper electrode on the first insulation layer; a step of forming a second insulation layer on the semiconductor substrate and the capacitor; a step of forming a first opening by selectively removing the second insulation layer; a step of forming a first wiring layer of a conductive material on the first opening; a step of forming a first interlayer insulation layer and forming a magnetic film at a position corresponding to a position different from the position where the first wiring layer is formed on the first interlayer insulation film; a step of forming a second interlayer insulation film on the first interlayer insulation layer and the magnetic film; and a step of forming an inductor on the second interlayer insulation film above the magnetic film.

By configuring as described above, the capacitor and the inductor are formed at different positions to the plane of the semiconductor substrate. Thus, the composite module can be made thin, and the distance between the capacitor and the inductor can be made large.

And, the step of forming the inductor has a step of forming a first coil pattern on the second interlayer insulation film above the magnetic film; a step of forming the third interlayer insulation film on the second interlayer insulation film and the first coil pattern; a step of forming an opening by etching a prescribed position to reveal at least a part of the first coil pattern; and a step of forming a second coil pattern which is connected to the first coil pattern via the opening. Thus, the inductance value of the inductor can be increased.

The first interlayer insulation film is formed to have a thickness to provide an appropriate distance between the semiconductor substrate and the magnetic film. Thus, by accurately controlling the thickness of the first interlayer insulation film when it is formed, the distance between the semiconductor substrate and the magnetic film can be controlled accurately.

The second interlayer insulation film is formed to have a thickness to provide an appropriate distance between the magnetic film and the first coil pattern. Thus, by accurately controlling the thickness of the second interlayer insulation film when it is formed, the distance between the coil and the magnetic film can be controlled accurately.

And, the composite module of the invention is a composite module having a capacitor, which is formed by stacking a first electrode layer, a dielectric layer and a second electrode layer, and a magnetic film loaded inductor provided with a magnetic film made of a magnetic material on a semiconductor substrate, wherein the magnetic film loaded inductor is provided with a coil pattern made of a dielectric substance, and a magnetic film made of a magnetic material which is disposed below, above or both sides of the coil pattern with an interlayer insulation film therebetween and in the proximity of the coil pattern; and disposed at a position above the capacitor and corresponding to the capacitor; and a distance between the coil pattern and the magnetic film is adjusted by a thickness of the interlayer insulation film.

By configuring as described above, the capacitor and the inductor are disposed in a vertical direction to the plane of the semiconductor substrate, so that the composite module can be formed in a small area. And, by accurately controlling the thickness of the interlayer insulation film when it is formed, the distance between the coil pattern and the magnetic film can be controlled accurately.

The coil pattern is a coil pattern having a multilayer structure formed by stacking multiple coil patterns. Thus, the inductor having a large inductance value can be formed.

A process of producing a composite module according to the present invention comprises a step of forming a first insulation layer on a surface of a semiconductor substrate; a step of forming a capacitor by stacking a lower electrode, a dielectric film and an upper electrode on the first insulation layer; a step of forming a second insulation layer on the semiconductor substrate and the capacitor; a step of forming a first opening by selectively removing the second insulation layer; a step of forming first wiring of a conductor material on the first opening; a step of forming a first interlayer insulation layer and forming a magnetic film at a position above the first interlayer insulation film corresponding to a position where the capacitor is formed; a step of forming a second interlayer insulation film on the first interlayer insulation layer and the magnetic film; and a step of forming an inductor by forming a coil on the second interlayer insulation film above the magnetic film; wherein the first interlayer insulation film is formed to have a thickness so to provide an appropriate distance between the semiconductor substrate and the magnetic film, and the second interlayer insulation film is formed to have a thickness so to provide an appropriate distance between the magnetic film and the coil.

By configuring as described above, the capacitor and the inductor are formed in a vertical direction to the plane of the semiconductor substrate, so that the composite module can be formed in a small area. And, the distance between the capacitor and the inductor can be made large.

And, by accurately controlling the thickness of the first interlayer insulation film when it is formed, the distance between the semiconductor substrate and the magnetic film can be controlled accurately. And, by accurately controlling the thickness of the second interlayer insulation film when it is formed, the distance between the coil and the magnetic film can be controlled accurately.

Here, the step of forming the inductor has a step of forming a first coil pattern on the second interlayer insulation film above the magnetic film; a step of forming a third interlayer insulation film on the second interlayer insulation film and the first coil pattern; a step of forming a third opening to reveal at least a part of the first coil pattern by etching a prescribed portion; and a step of forming a second coil pattern which is connected to the first coil pattern via the third opening. Thus, the inductance value of the inductor can be increased.

DESCRIPTION OF THE PREFERRED EMBODIMENTS

Embodiments of a high-frequency module and its production process according to the present invention will be described in detail with reference to the accompanying drawings.

Figure 1:
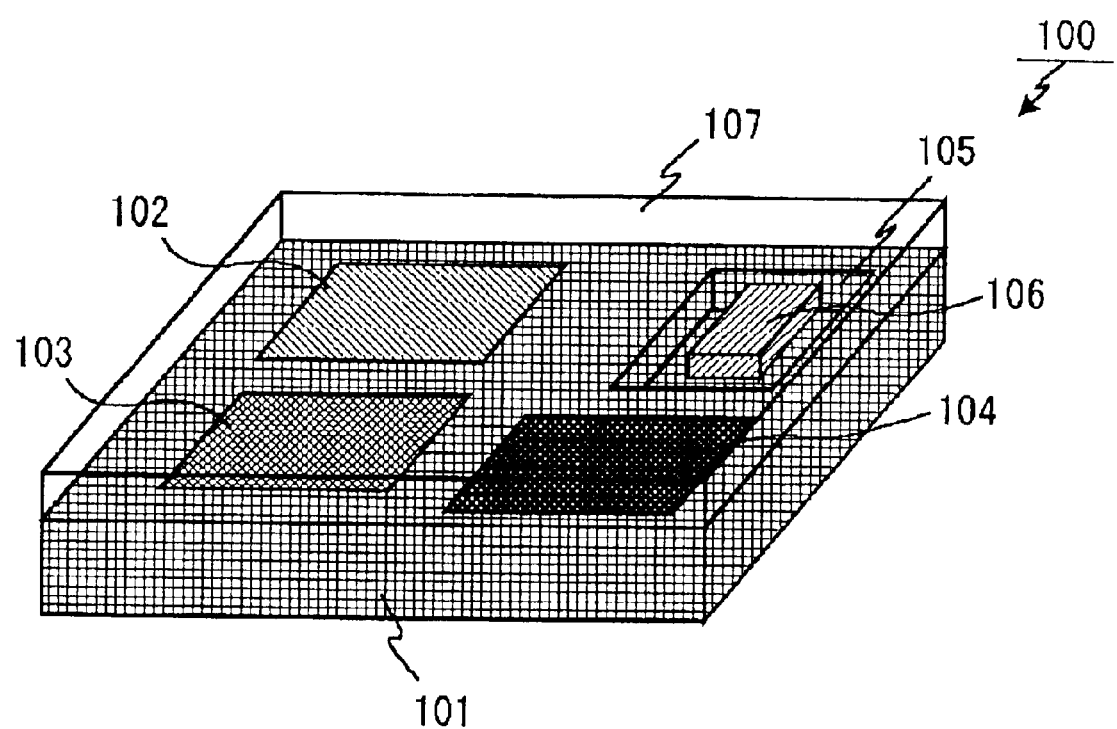
FIG. 1 is a diagram schematically showing a structure of a high-frequency module which is one embodiment of the composite module according to the present invention.

FIG. 1 is a diagram conceptually showing a structure of an embodiment of the high-frequency module according to the present invention.

FIG. 1 shows that a high-frequency module 100 has a silicon semiconductor substrate (Si substrate) 101 as a platform, on which a control circuit 104 including passive elements 102, 103 and an active element each made of a thin film of a different type of material is formed.

The passive elements 102, 103 include, for example, a high-frequency high-capacity bypass capacitor, a high-frequency choke coil and a matching capacitor, and a matching inductor, and the like, which configure a bias circuit of a power amplifier.

Here, the high-frequency high-capacity bypass capacitor is formed as an MIM capacitor having a multilayer structure of metal, a capacity insulation film and metal, for example, $Pt/SrTiO_3/Pt$, as described later in detail, and the high-frequency choke coil is formed of a magnetic film loaded coil.

The control circuit 104 having the above configuration is directly formed on the Si substrate 101 or mounted as a bare chip. And, the latter is promising in this case in view of characteristics and costs at a high frequency.

And, a 100 μm counter sunk portion 105 is formed on the Si substrate 101 by for example wet etching, and a high-frequency integrated circuit (GaAs MMIC) 106 is embedded in the counter sunk portion 105.

The control circuit 104, which includes the passive elements 102, 103 and the active element, and the high-frequency integrated circuit 106 are mutually connected by a multilevel interconnection 107 using an interlayer insulation film.

By configuring as described above, parts such as a high-capacity capacitor and a high-Q filter which are conventionally required to be externally connected can be integrated.

Then, an application of the high-frequency module and its production process according to the present invention to a power amplifier module for a W-CDMA portable terminal, which is expected to become widespread quickly, will be described.

The power amplifier module for a W-CDMA portable terminal operates at $f0=1.95$ GHz.

A power amplifier for this power amplifier module for W-CDMA is required to have the following main specifications.

| | |
|---|---|
| Collector voltage: | 3.5 V |
| Standby electric current: | 60 mA |

-continued

| Frequency band: | 1920–1980 MHz |
| --- | --- |
| Output power: | 27 dBm |
| Efficiency: | 35% (P0=27 dBm) |
| Adjacent channel power ratio: | −40 dBc (POUT=27 dBm, Δf =5 MHz, 3.84 MHz BW) |
|  | −50 dBc (POUT=27 dBm, Δf =10 MHz, 3.84 MHz BW) |

The power amplifier of this type is generally required to satisfy both attainment of linearity and high efficiency, and, therefore, it is necessary to have a matching circuit which performs matching to provide maximum effective power when an input state and a stage are joined to satisfy both linearity and high efficiency in an output stage.

The linearity of the power amplifier for W-CDMA is evaluated by an ACPR (Adjacent Channel leakage Power Ratio). Modulation employed here is based on an HPSK method, and a difference between average power and a peak wave height value is about 3.5 dB. Therefore, a good ACPR value can be obtained by designing with backoff of the above value or higher.

But, it is required to design an actual circuit with a smaller backoff value because of a problem of efficiency in designing it. Accordingly, as a result of performing tertiary (IM3) and quintic (IM5) analyses of intermodulation distortion, a circuit was designed to decrease the backoff by increasing the even-ordered harmonic.

Meanwhile, the efficiency of the power amplifier can be indicated by RF output power/DC input power, so that a reactive power portion which is not taken out as output power may be decreased.

Therefore, in this embodiment, the overlapping of a voltage waveform and a current waveform is decreased to provide high efficiency by changing the voltage waveform to a rectangular wave and the current waveform to a half wave at a collector end.

Because the rectangular wave can be obtained by combining a fundamental wave with an even-ordered harmonic, it is designed with the harmonic amount at the collector end used as a parameter. And, when designing, the drive class of the bias was AB class.

Figure 2:
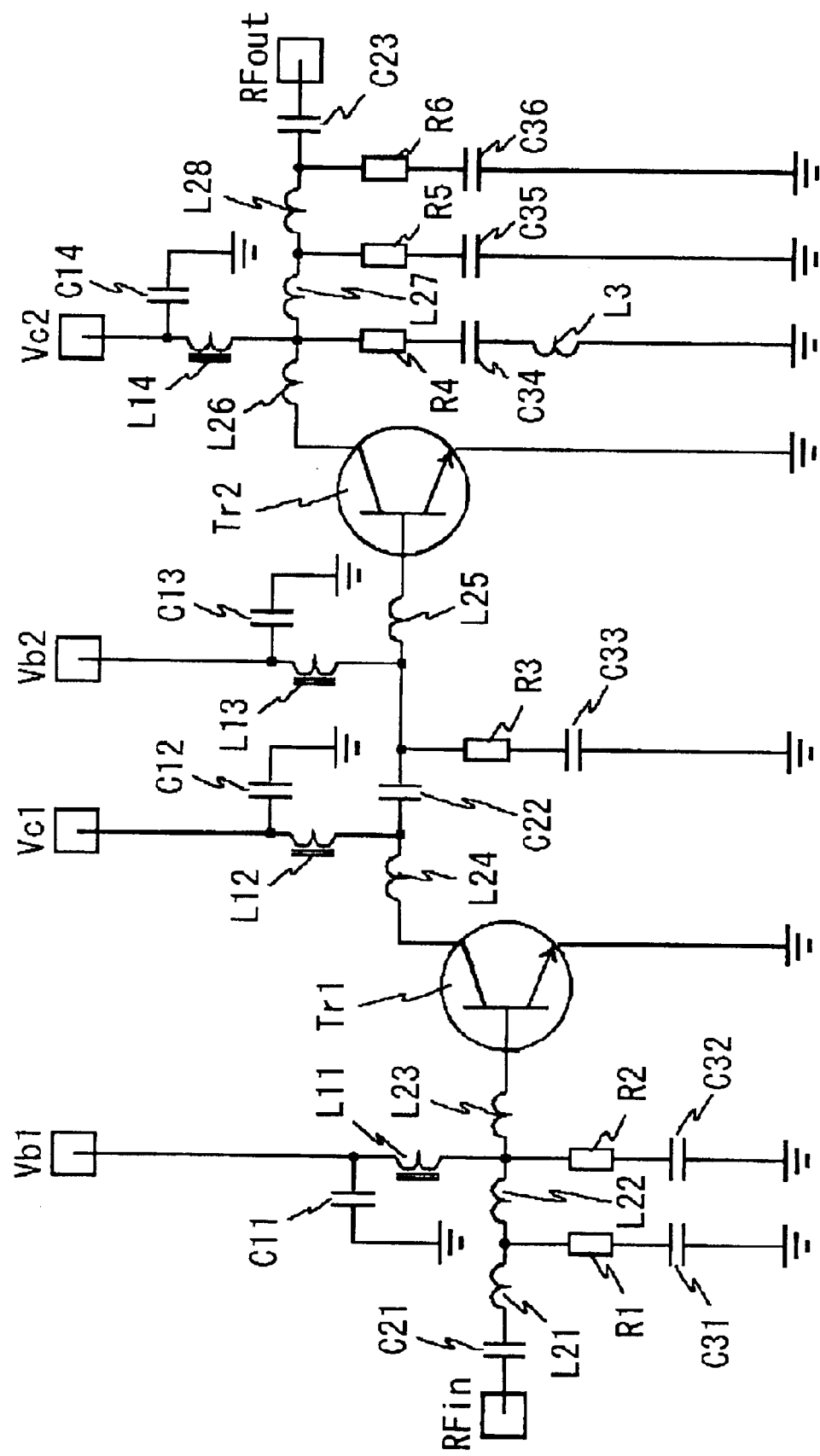
FIG. 2 is a circuit diagram showing that the high-frequency module shown in FIG. 1 is applied to a power amplifier module for a W-CDMA portable terminal.

Accordingly, there was obtained the circuitry shown in FIG. 2 as a result of designing the matching circuit while the linearity and the high efficiency which were in a trade-off relationship were kept in balance.

A 2-stage GaAs HBT transistor was used for the power transistor considering miniaturization and cost reduction.

In FIG. 2, Tr1 and Tr2 denote GaAs HBT transistors, Vb1, Vb2, Vc1 and Vc2 denote power supply terminals, RFin denotes a high-frequency input terminal, RFout denotes a high-frequency output terminal, C11, C12, C13 and C14 denote high-frequency high-capacity bypass capacitors, L11, L12, L13 and L14 denote high-frequency choke coils, C21, C22 and C23 denote matching capacitors, L21 to L28 denote matching coils, R1 to R6 denote resistors or transmission lines, and C31 to C36 denote capacitors.

As shown in FIG. 2, this power amplifier uses the bypass capacitors C11, C12, C13, C14 regardless of digital or analog for suppression of fluctuation in power from the outside and stabilization of the circuit.

In the power amplifier module of this embodiment, an SrTiO$_3$ film is formed on an Si substrate, the obtained substrate is used to form an MIM capacitor having a multilayer structure of Pt/SrTiO$_3$/Pt, and the MIM capacitor is used to configure the bypass capacitors C11, C12, C13, C14.

Figure 3:
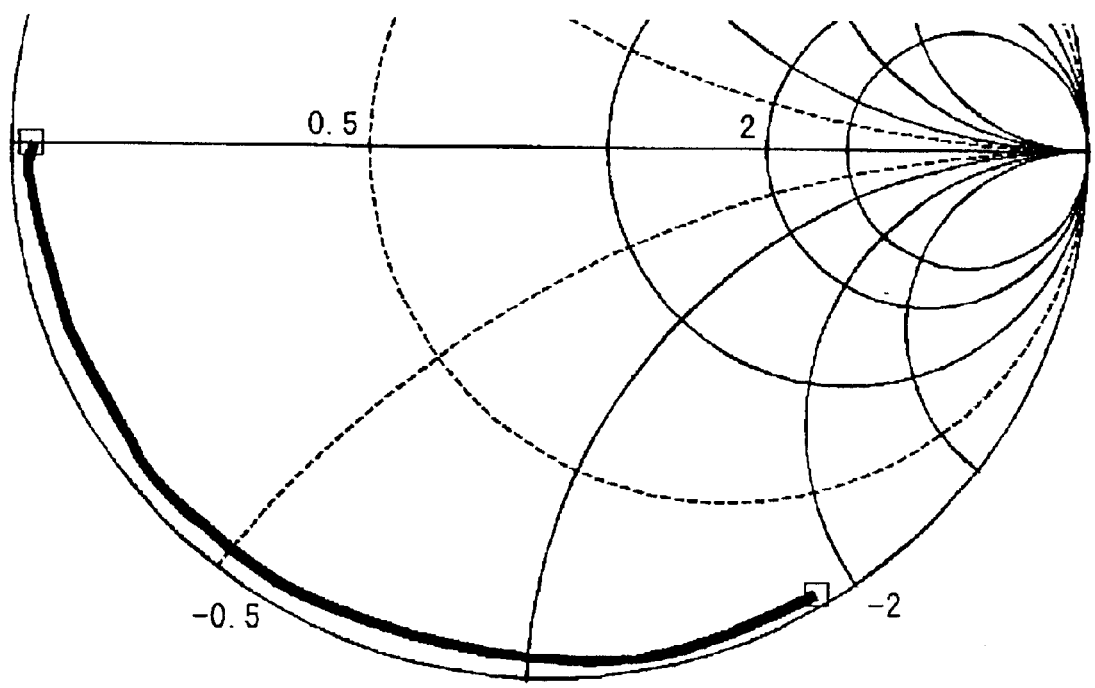
FIG. 3 is a diagram showing a high-frequency impedance characteristic of an MIM capacitor which configures a bypass capacitor in the circuit shown in FIG. 2.

The high-frequency impedance characteristic of the MIM capacitor is shown in FIG. 3.

In FIG. 3, the bypass capacitors C11, C12, C13, C14 configured of the MIM capacitor are determined to have 470 pF so to have a sufficiently low impedance at 10 MHz or below on the power amplifier module.

As a result of the nonlinear load analysis of the power amplifier, a maximum voltage produced on the circuit was 7V. Therefore, the SrTiO$_3$ film was determined to have a thickness of 150 nm so that the capacitor had a withstand voltage of 10V At that time, the bypass capacitor had a size of 180 μm square.

In FIG. 2, DC power for driving the GaAsHBT transistors Tr1, Tr2 which are active elements is applied from the power supply terminals Vb1, Vb2, Vc1, Vc2 through the high-frequency choke coils L11, L12, L13, L14.

But, in a thin-film conductor such as a conventional spiral conductor, the high-frequency choke coils L11, L12, L13, L14 cause an increase in occupied area and series resistance because their wiring lengths become large when the element value is increased.

Figure 4:
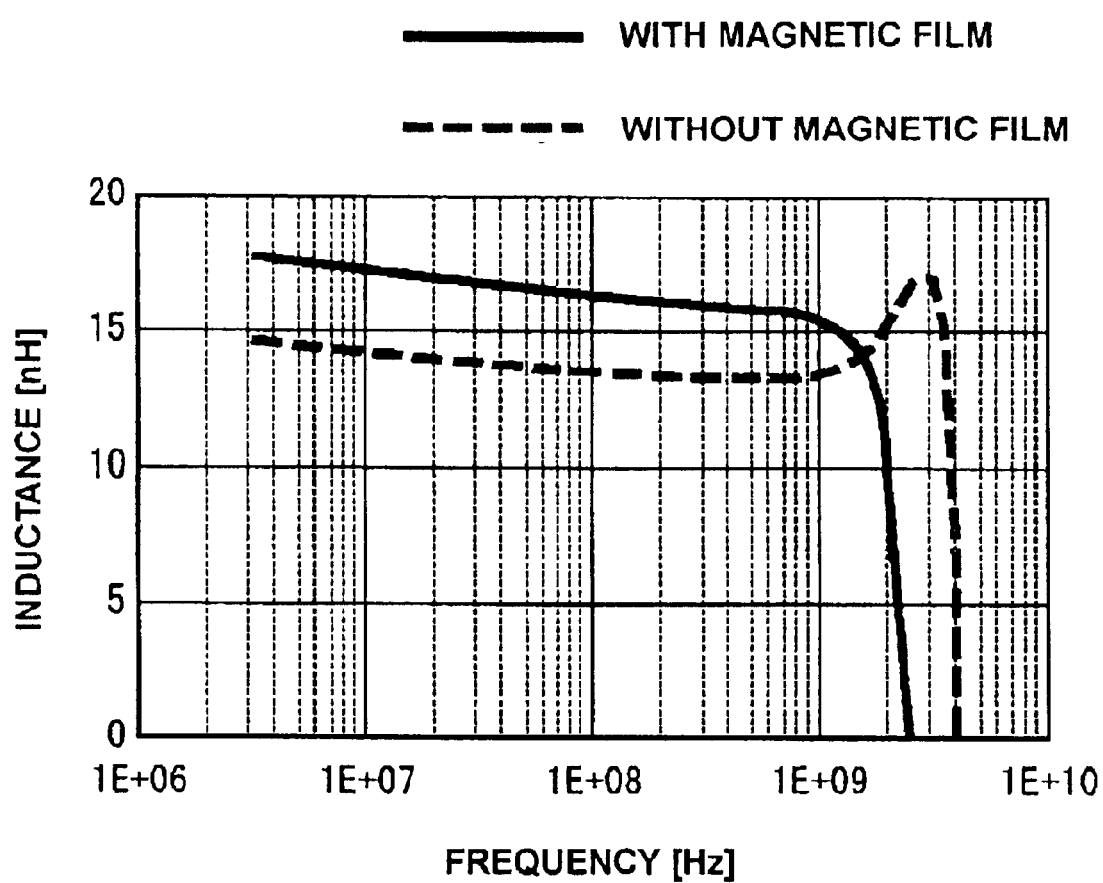
FIG. 4 is a diagram showing an inductance value of a spiral inductor which has loaded a nanogranular magnetic thin film configuring a high-frequency choke coil in the circuit shown in FIG. 2.

Therefore, for the power amplifier module of this embodiment, a nanogranular magnetic thin film of which magnetic properties are not lost even in a high-frequency region was developed and loading on a two-layer spiral inductor to effectively confine a surrounding magnetic flux to improve an inductance value to 20% as shown in FIG. 4.

Use of this magnetic thin film loaded spiral inductor can reduce a leakage of RF from an RF section to the power supply and can minimize a voltage drop.

A specific design value was determined to be 17 nH based on 50 Ω matching so that the impedance became high enough at 2 GHz. At that time, the inductor had dimensions of 380×420 μm, Qmax of 5.2 (330 MHz) and series resistance of 2.54 Ω.

When multilevel interconnection is formed on the same substrate as the active element such as the MMIC, SiN or an organic film (polyimide, BCB) is used for its interlayer insulation film. In this case, the film generally has a relatively small thickness of 5 μm or below in either case. When a transmission line is formed in the above layer structure, a line width becomes small, and a loss increases.

Figure 12:
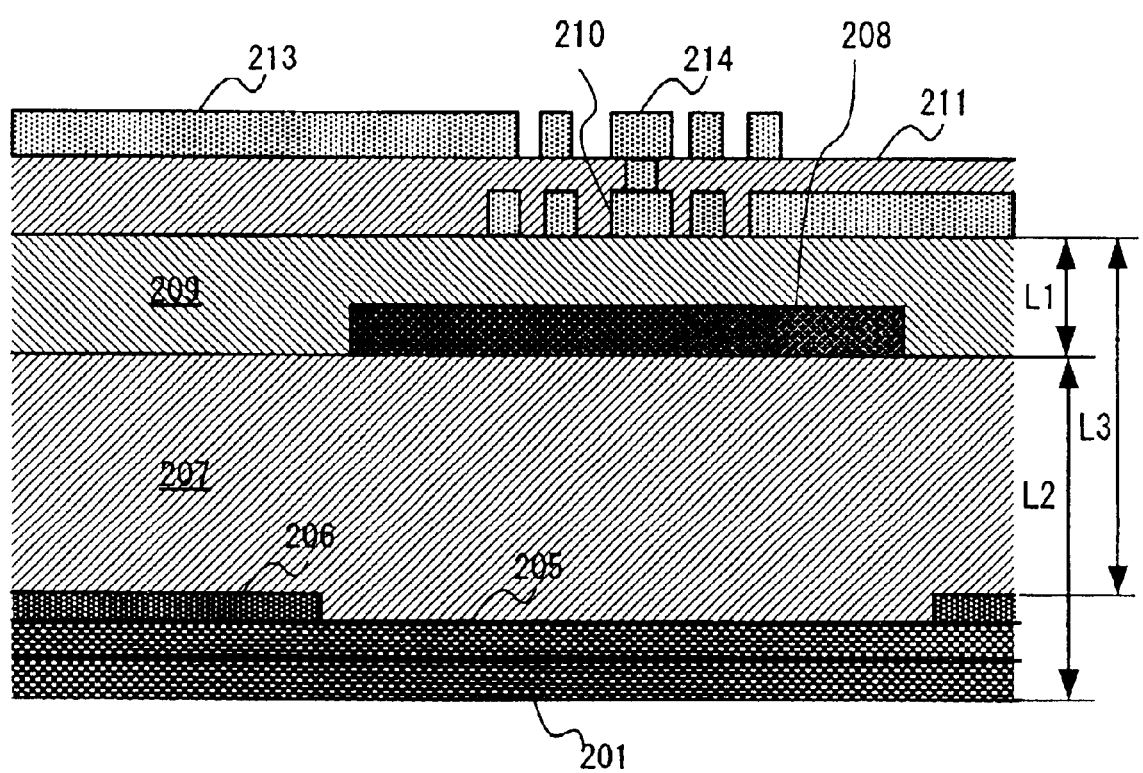
FIG. 12 is a diagram illustrating the details of a magnetic thin film loaded spiral inductor of a power amplifier module for a W-CDMA portable terminal according to the present invention.

Therefore, the transmission line of this embodiment was formed using polyimide (Er=2.9) exceeding 15 μm as an interlayer insulation film (indicated by L3 in FIG. 12).

In the high-frequency module having the circuit structure as shown in FIG. 2, the characteristic of the circuit as the whole largely depends on a Q value of the matching inductor. Especially, when the frequency is approximately 2 GHz, the required element value inevitably becomes large, and an area increase and the Q value drop become prominent.

Figure 5:
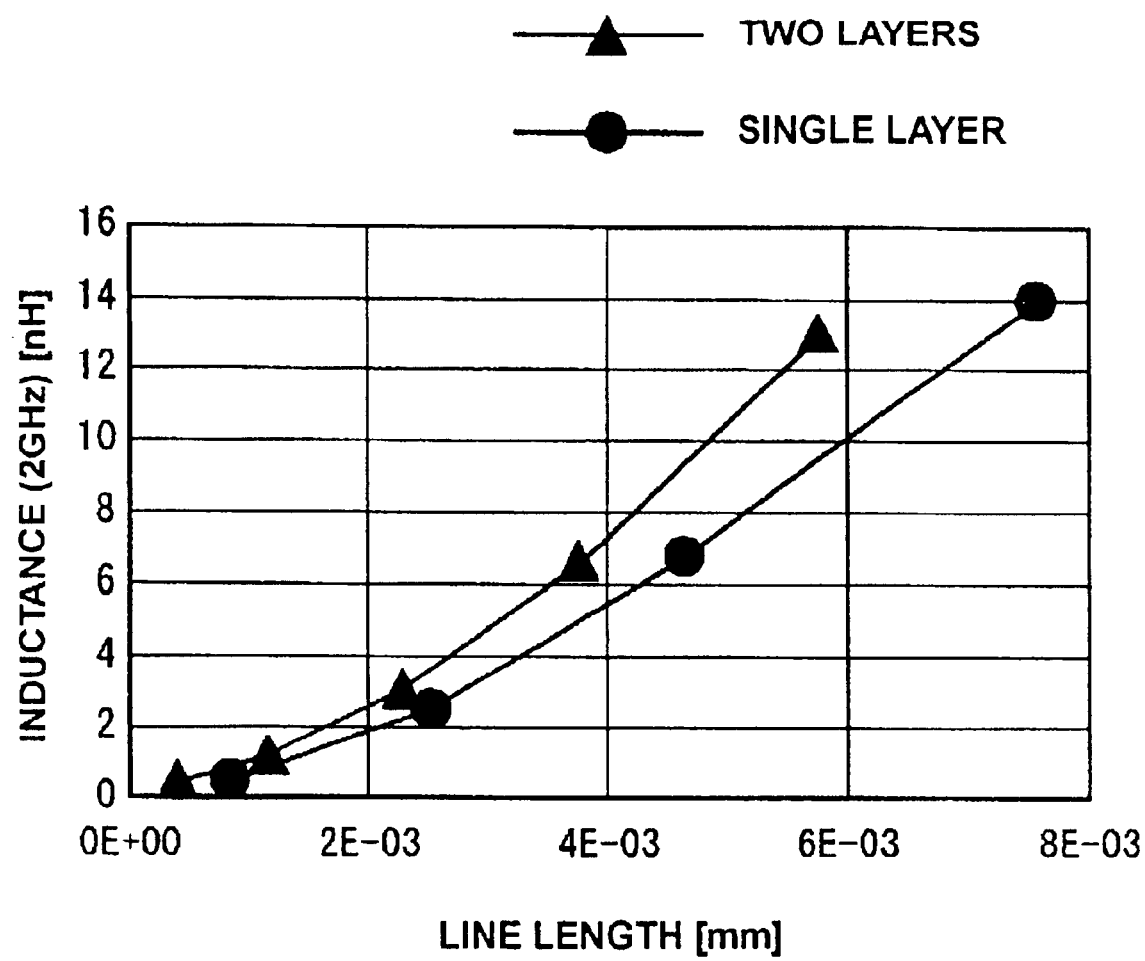
FIG. 5 is a diagram showing a characteristic of a spiral inductor having a two-layered structure, which configures a matching capacitor in the circuit shown in FIG. 2.

Accordingly, a two-layered spiral inductor was used for matching in this embodiment. Its characteristic is shown in FIG. 5. It is seen from FIG. 5 that an L value per unit length has increased as compared with that of a single layered structure.

Figure 6:
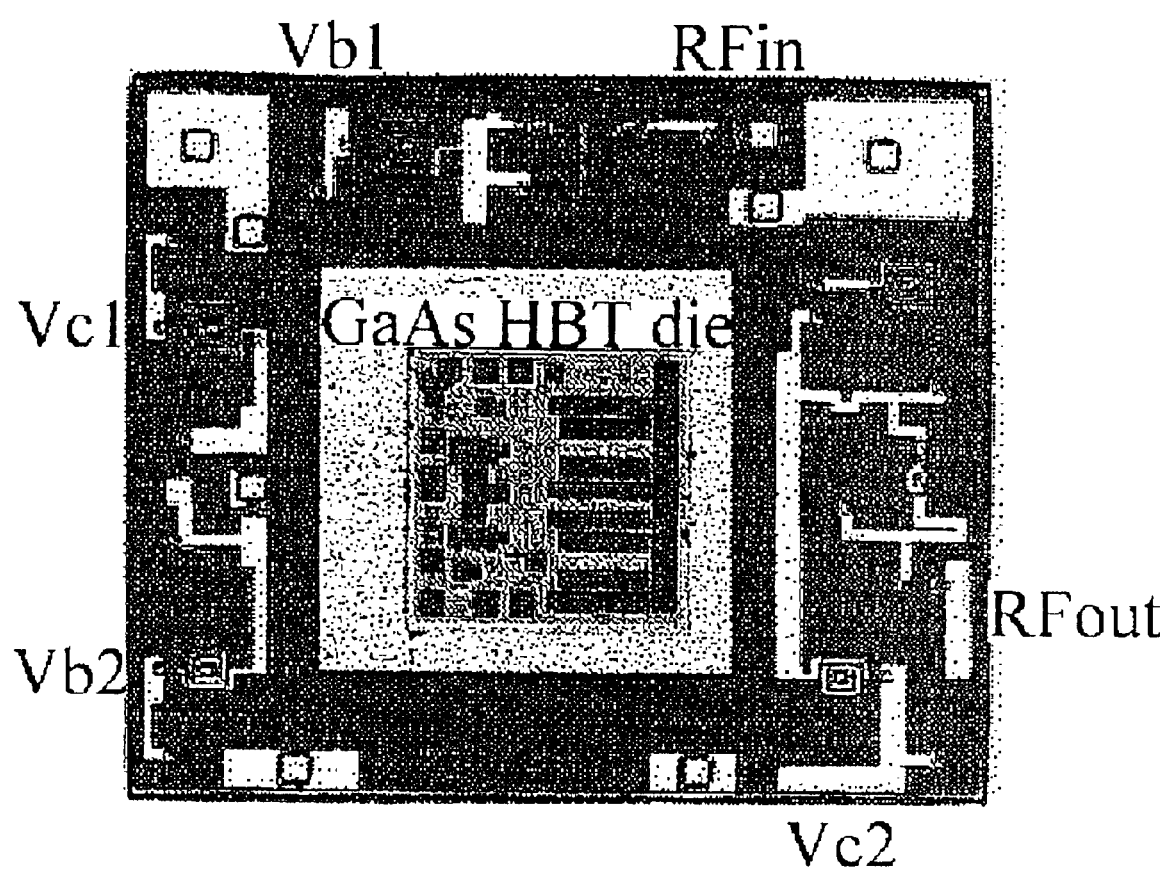
FIG. 6 is a diagram showing an example layout of a thin-film module formed according to the circuit of FIG. 2.

An example layout of a thin-film module configured as described above is shown in FIG. 6. FIG. 6 shows a considerably roomy layout, but it could be made to have a size of 3.5×2.9 mm square and a thickness of 500 μm.

Because a high resistant Si substrate excelling in radiation property was used in this embodiment, thermal resistance could be lowered to ⅕ of that of an alumina substrate.

Figure 7:
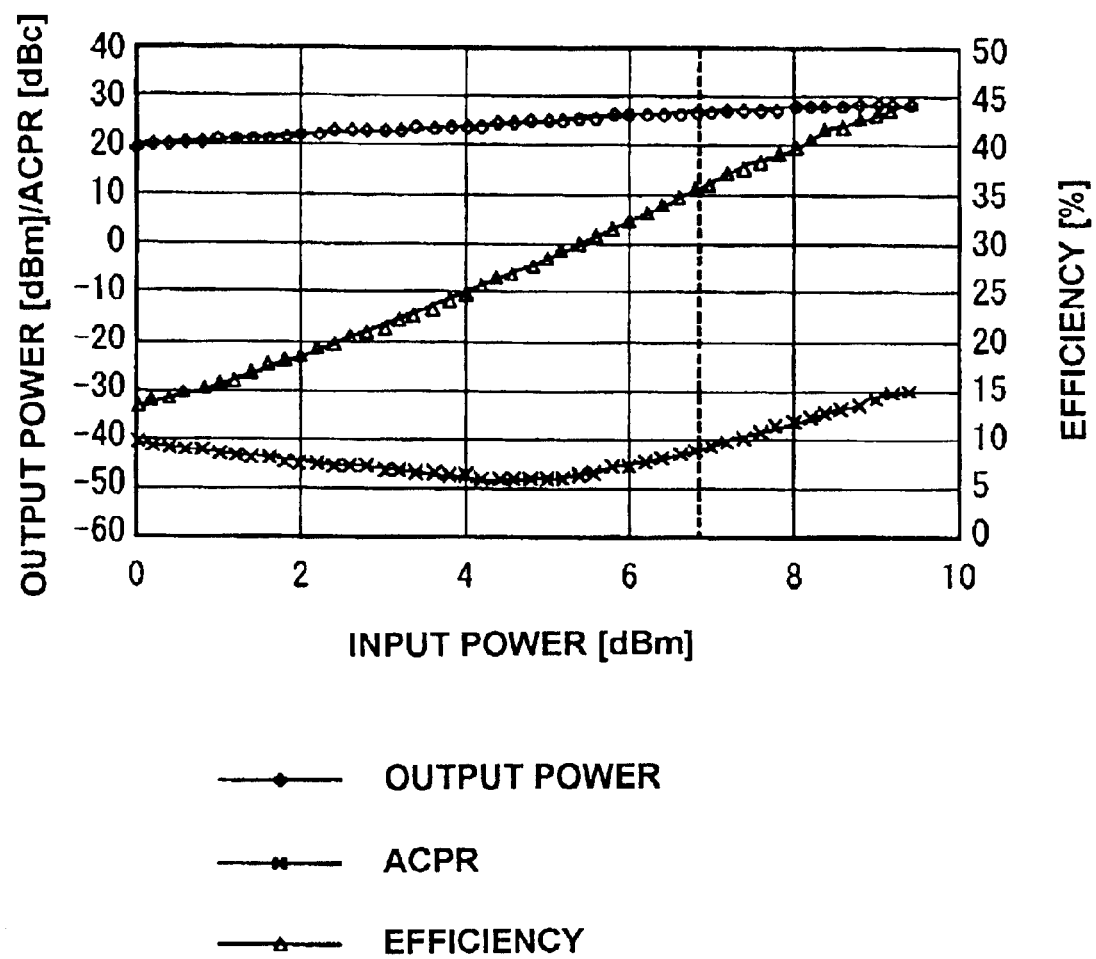
FIG. 7 is a diagram showing a gain and an ACPR characteristic of a power amplifier module formed according to the circuit shown in FIG. 2.

The power amplifier module configured as described above had gain and ACPR characteristic as shown in FIG. 7.

Then, a process of producing the above power amplifier module for a W-CDMA portable terminal will be described in detail with reference to FIG. 8 to FIG. 11.

Figure 8A:
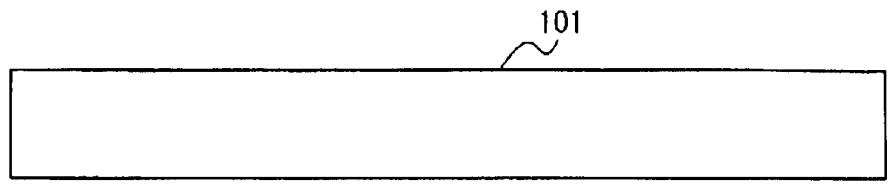
FIGS. 8(a) to 8(e) are diagrams illustrating a process of producing a power amplifier module for a W-CDMA portable terminal according to the present invention.
Figure 8B:
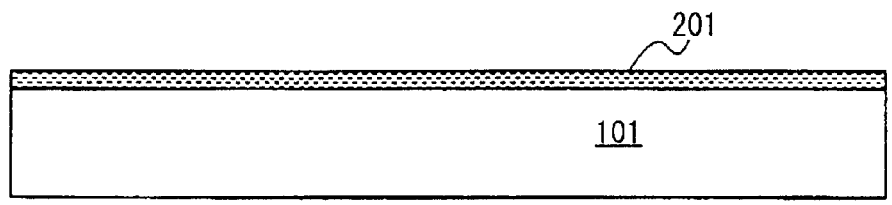

To produce the power amplifier module, an SiO$_2$ film 201 is formed as shown in FIG. 8(b) on an Si substrate 101 having high resistance of 4 KΩ/cm as shown in FIG. 8(a).

Figure 8C:
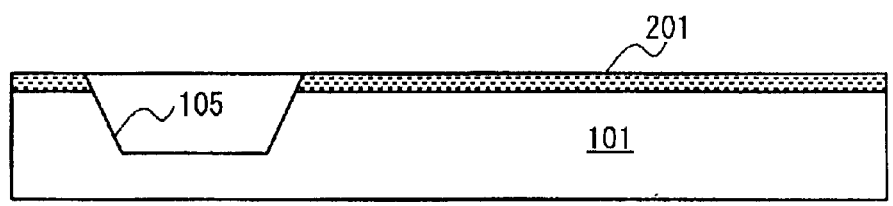

Then, a counter sunk portion 105 of 100 μm, in which a high-frequency integrated circuit 106 is embedded, is formed in the Si substrate 101 by wet etching as shown in FIG. 8(c).

A Pt electrode film 202 having a thickness of 2 μm which becomes a lower electrode is formed on the SiO$_2$ film 201 by sputtering, an SrTiO$_3$ film 203 of a ferroelectric material is formed by a sol-gel process, a sputtering process, a CVD process or the like at places where the high-frequency high-capacity bypass capacitors C11, C12, C13, C14 on the Pt electrode film 202 are formed, and a Pt electrode film 204 which becomes an upper electrode is formed thereon in the same way as the Pt electrode film 202.

Figure 8D:
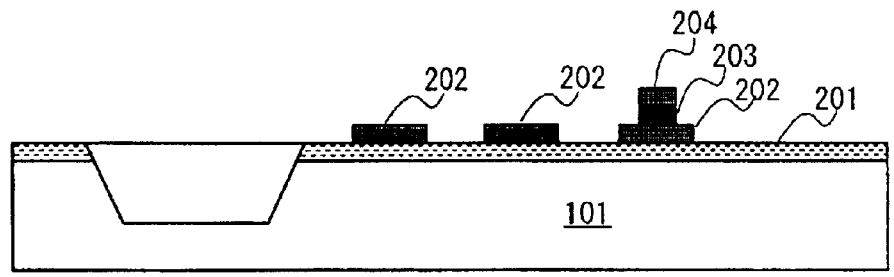

Then, as shown in FIG. 8(d), the Pt electrode film 202 as the lower electrode is patterned to comply with the size of the capacitor, and the Pt electrode film 204 as the upper electrode and the SrTiO$_3$ film 203 are patterned. In this state, a thermal treatment is performed to exploit ferroelectricity of the SrTiO$_3$ film 203 to complete a high-frequency high-capacity bypass capacitor portion having a multilayer structure of the Pt electrode film 202/SrTiO$_3$ film 203/Pt electrode film 204.

Figure 8E:
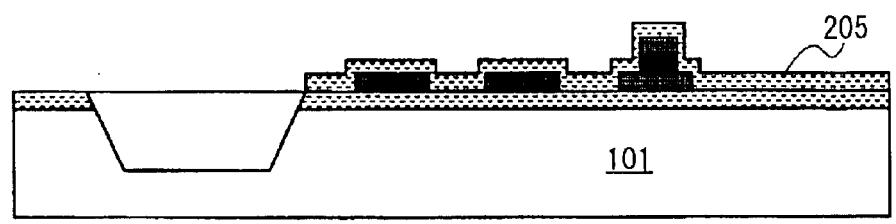

Then, an SiO$_2$ film 205 is formed to form the matching capacitors C21, C22, C23 as shown in FIG. 8(e).

Figure 9A:
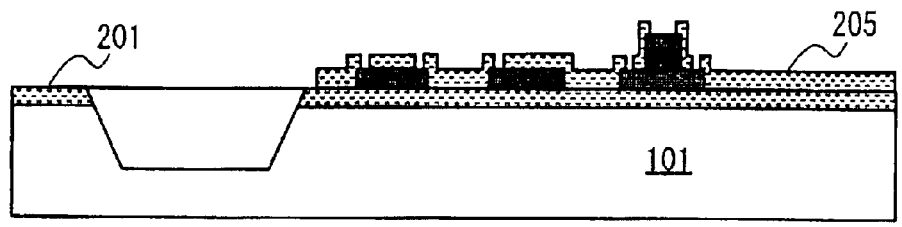
FIGS. 9(a) to 9(d) are diagrams illustrating the process of producing the power amplifier module for the W-CDMA portable terminal according to the present invention.
Figure 9B:
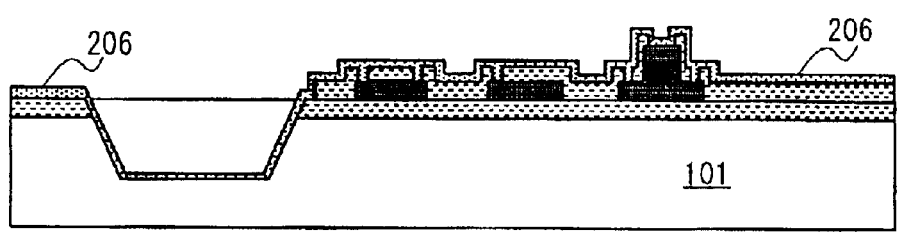
Figure 9C:
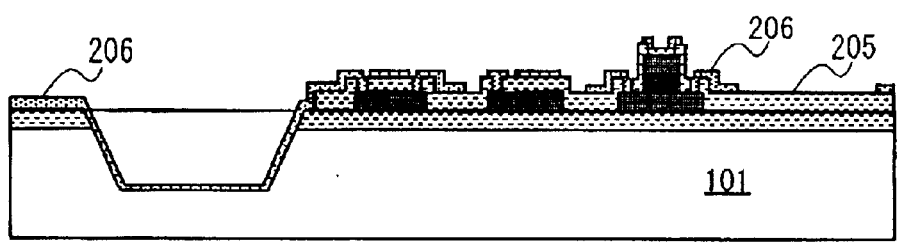

As shown in FIG. 9(a), the SiO$_2$ film 205 is patterned, an Al wiring layer 206 which becomes a ground electrode is formed thereon as shown in FIG. 9(b), and the Al wiring layer 206 is patterned as shown in FIG. 9(c) to complete a matching capacitor having a multilayer structure of the Pt electrode film 202/SiO$_2$ film 205/Al wiring layer 206.

Figure 9D:
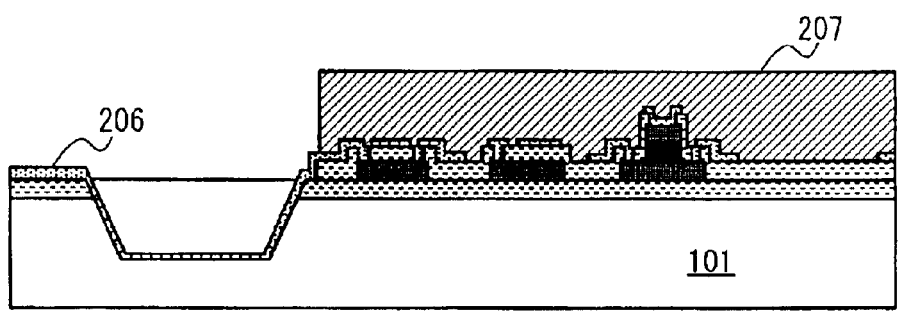

Then, as shown in FIG. 9(d), a first polyimide layer 207 which is an interlayer insulation film is formed by applying polyimide on the above high-frequency high-capacity bypass capacitor portion and matching capacitor portion. The first polyimide layer 207 has a thickness of 7 μm for example.

Figure 10A:
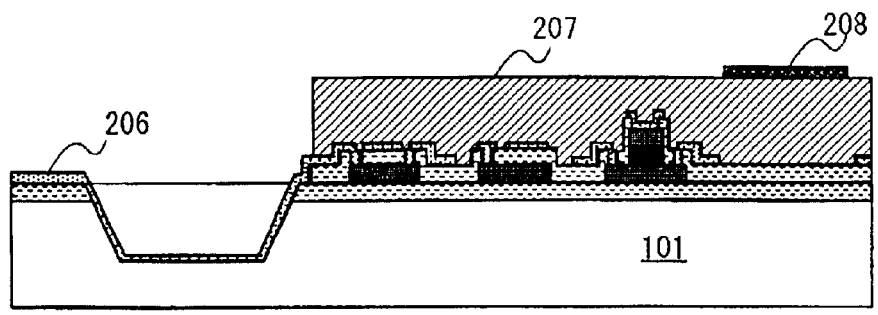
FIGS. 10(a) to 10(c) are diagrams illustrating the process of producing the power amplifier module for the W-CDMA portable terminal according to the present invention.

To produce a magnetic thin film loaded spiral inductor, a magnetic film 208 is formed on the first polyimide layer 207 by sputtering as shown in FIG. 10(a). The magnetic film 208 is a nanogranular magnetic thin film which is not impaired its magnetic properties even in a high frequency region.

Figure 10B:
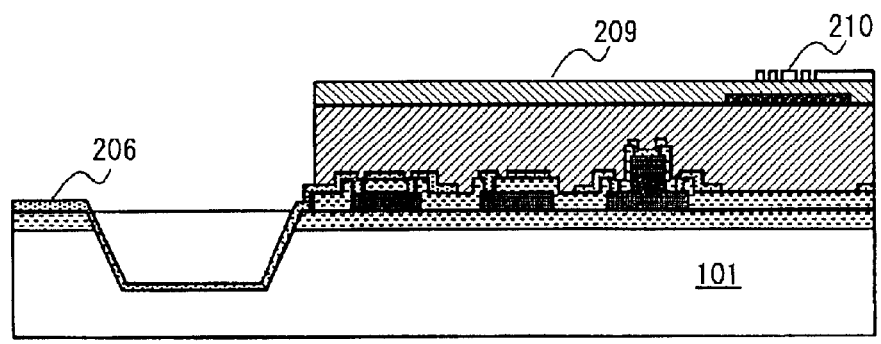

Then, a second polyimide layer 209 is formed as shown in FIG. 10(b), and a first inductor pattern 210 is formed on the second polyimide layer 209.

A distance between the first inductor pattern 210 and the magnetic film 208 can be determined by the thickness of the second polyimide layer 209, and the second polyimide layer 209 is determined to have a thickness of 7 μm here.

Figure 10C:
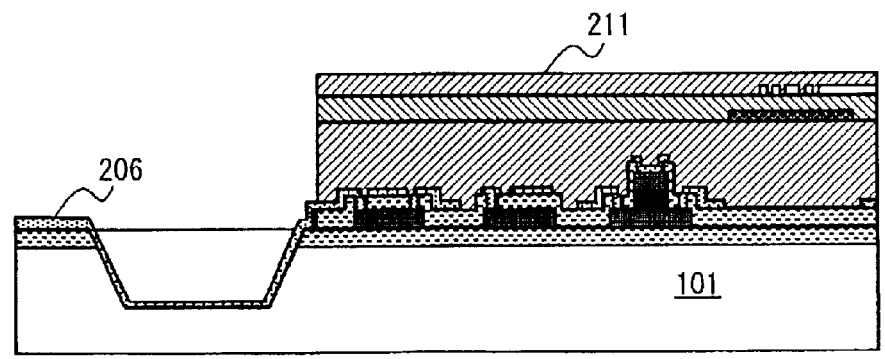

Then, a third polyimide layer 211 is formed on the first inductor pattern 210 as shown in FIG. 10(c). The third polyimide layer 211 is also determined to have a thickness of 7 μm.

Figure 11A:
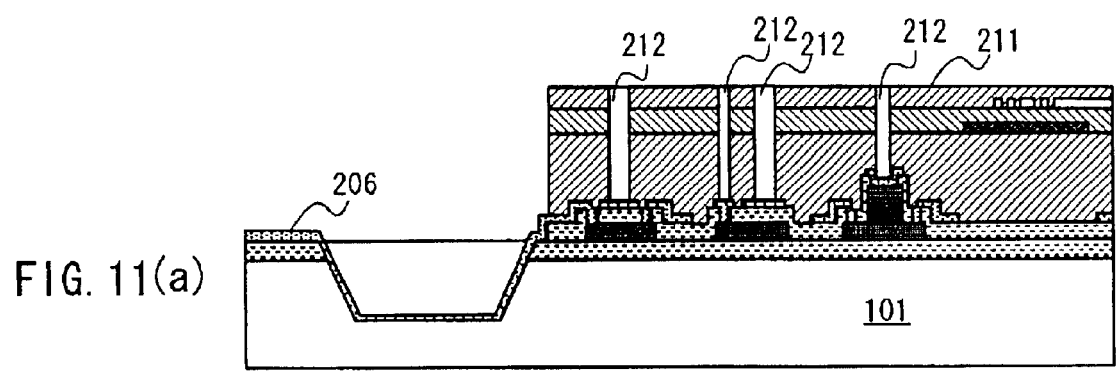
FIGS. 11(a) to 11(c) are diagrams illustrating the process of producing the power amplifier module for the W-CDMA portable terminal according to the present invention.

As shown in FIG. 11(a), through holes 212 are formed to connect the previously formed high-frequency high-capacity bypass capacitor portion and matching capacitor portion to an Al wiring layer 213 to be formed next.

Figure 11B:
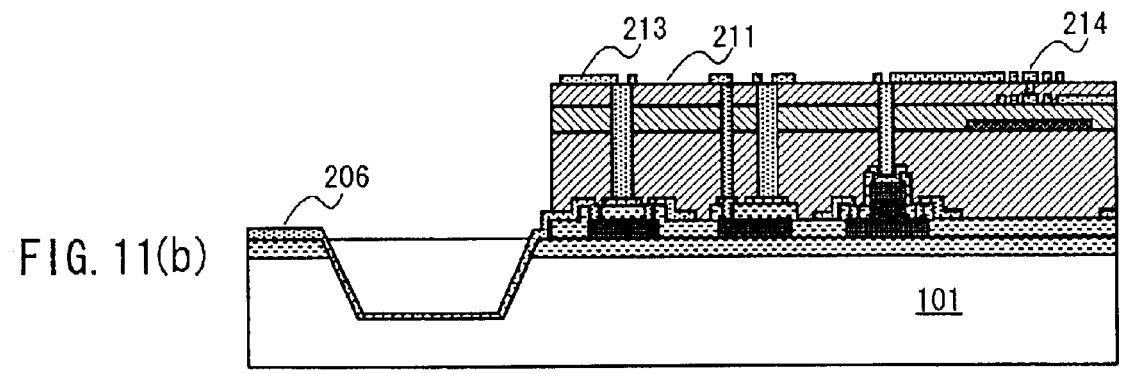

Then, the Al wiring layer 213 and a second inductor pattern 214 are patterned on the third polyimide layer 211 as shown in FIG. 11(b), and the Al wiring layer 213 is connected to the high-frequency high-capacity bypass capacitor portion and the matching capacitor portion via the through holes 212 to complete a magnetic thin film loaded spiral inductor which is formed of the magnetic film 208, the first inductor pattern 210 and the second inductor pattern 214.

Figure 11C:
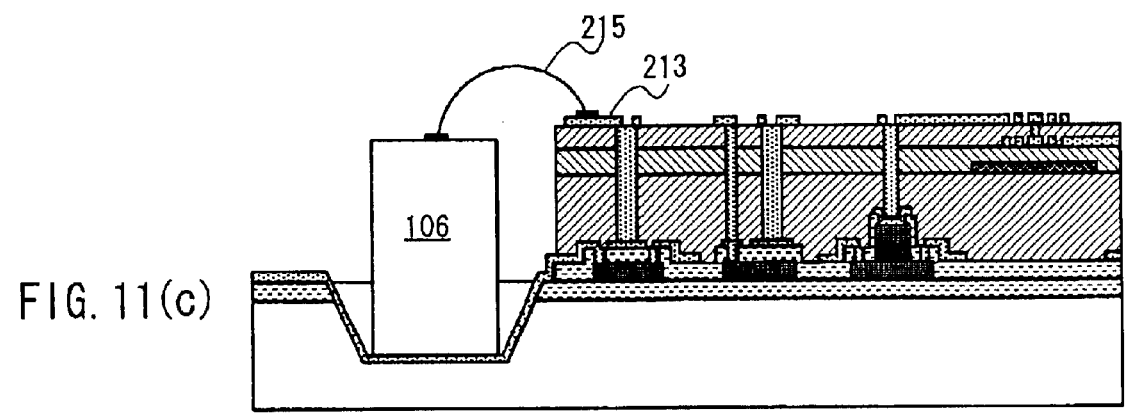

As shown in FIG. 11(c), the high-frequency integrated circuit 106 is embedded in the counter sunk portion 105 formed in FIG. 8(c) and connected to the Al wiring layer 213 by a wire bonding 215 to complete the power amplifier module.

As shown in FIG. 12, the magnetic thin film loaded spiral inductor which functions as high-frequency choke coils L11, L12, L13, L14 is formed by the magnetic film 208 formed on the first polyimide layer 207, the first inductor pattern 210 formed on the second polyimide layer 209, and the second inductor pattern 214 formed on the third polyimide layer 211. The properties of the magnetic thin film loaded spiral inductor are variable depending on a distance L1 between the first inductor pattern 210 and the magnetic film 208.

In the above configuration, the distance L1 between the first inductor pattern 210 and the magnetic film 208 is determined by the thickness of the second polyimide layer 209. Therefore, the distance L1 between the first inductor pattern 210 and the magnetic film 208 can be determined to have an appropriate value by adjusting the thickness of the second polyimide layer 209.

Figure 13:
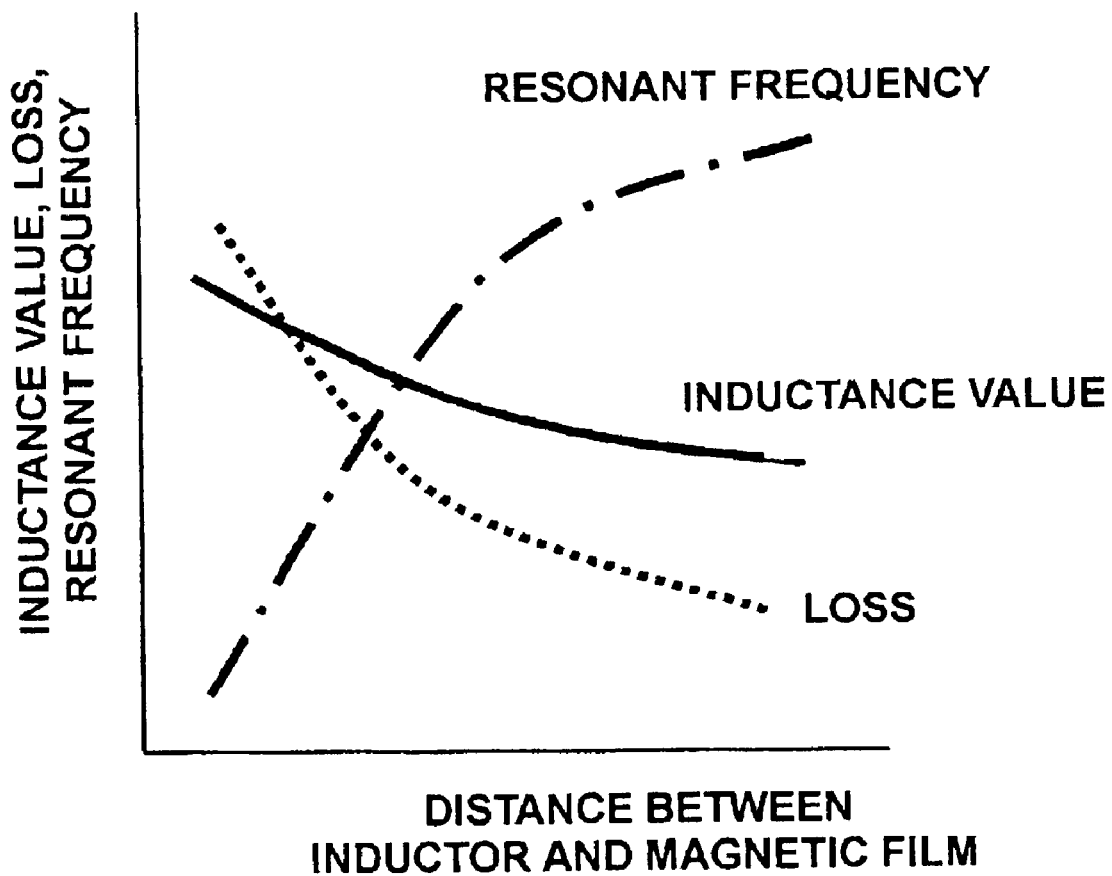
FIG. 13 is a characteristic diagram showing a relationship among an inductance value, a loss and a resonant frequency according to a distance between an inductor and a magnetic film of a magnetic thin film loaded spiral inductor of a power amplifier module for a W-CDMA portable terminal according to the present invention.
Figure 14:
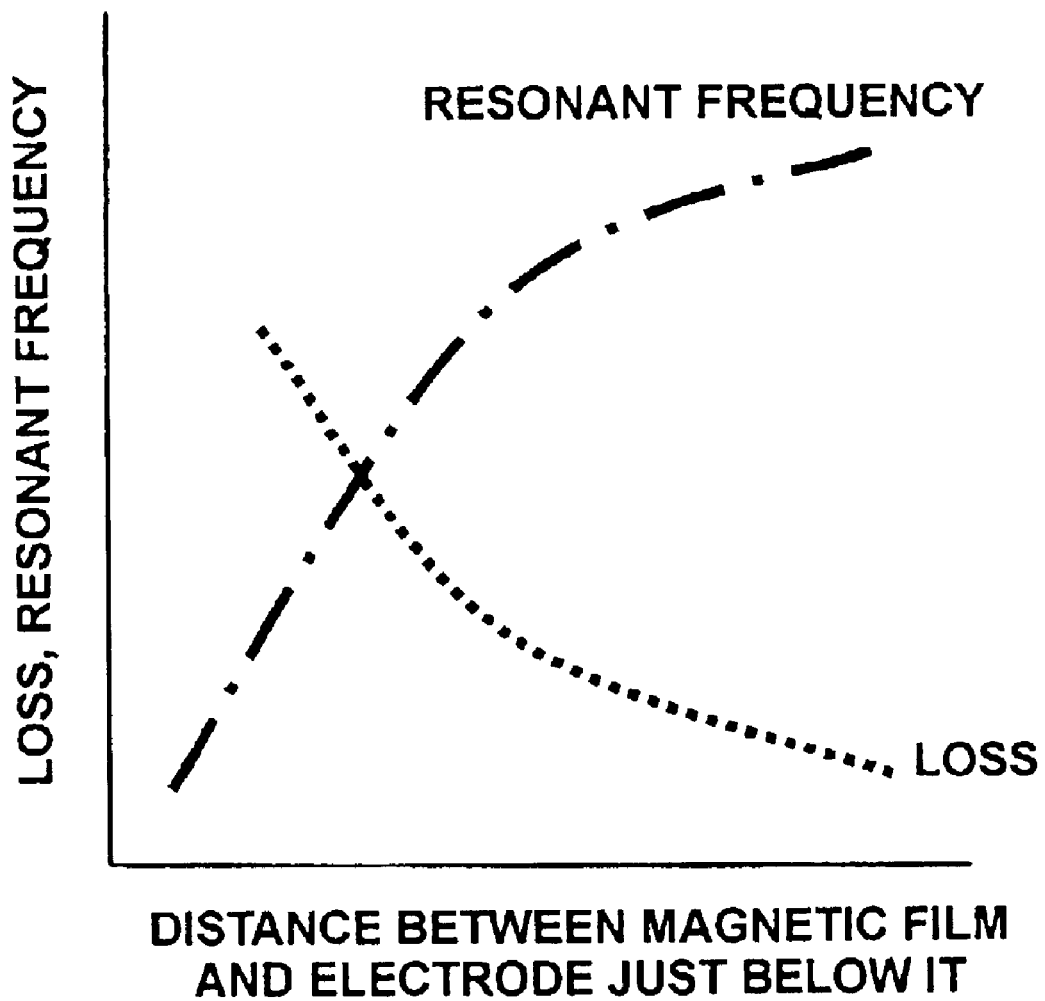
FIG. 14 is a characteristic diagram showing a relationship between a loss and a resonant frequency according to a distance between a magnetic film of a magnetic thin film loaded spiral inductor and an electrode just below it in a power amplifier module for a W-CDMA portable terminal according to the present invention.

Because the magnetic film 208 formed of the nanogranular magnetic thin film generally has electric conductivity, when the magnetic film 208 is loaded on the first inductor pattern 210 and the second inductor pattern 214 to raise inductance, the magnetic film 208 is electromagnetically coupled to the first inductor pattern 210 and the second inductor pattern 214, resulting in a loss. Such a situation is shown in FIG. 13.

Generally, the reduction of the distance L1 between the first inductor pattern 210 and the magnetic film 208 increases a confined amount of magnetic flux produced from the first inductor pattern 210 and the second inductor pattern 214 and raises inductance but also increases a loss and lowers a resonant frequency.

Meanwhile, when the distance L1 between the first inductor pattern 210 and the magnetic film 208 is increased, a loss decreases, and the resonant frequency rises, but an inductance value lowers, and the effect of loading the magnetic film 208 lowers.

Therefore, to cause the magnetic thin film loaded spiral inductor to function effectively, it is necessary to optimize the distance L1 between the first inductor pattern 210 and the magnetic film 208, but the distance L1 between the first inductor pattern 210 and the magnetic film 208 in the above configuration is determined based on the thickness of the second polyimide layer 209. Therefore, the distance L1 between the first inductor pattern 210 and the magnetic film 208 can be set easily to an optimum value by adjusting the thickness of the second polyimide layer 209.

The same situation as that described above occurs also occurs between the magnetic film 208 and a conductive substance (corresponding to the Al wiring layer 206 or the Si substrate 101) just below the magnetic film 208. In this case, there is a unidirectional tendency that when a distance L2 between the magnetic film 208 and the conductive substance just below it is small, a loss increases and the resonant frequency lowers, but when the distance L2 between the magnetic film 208 and the conductive substance just below it increases, a loss decreases, resulting in causing saturation. But, it is disadvantageous for the process to increase the distance L2 between the magnetic film 208 and the conductive substance just below the magnetic film 208. Therefore, it is also necessary to optimize the distance L2 between the magnetic film 208 and the conductive substance just below the magnetic film 208.

Therefore, this embodiment removes the Al wiring layer 206 just below the magnetic film 208 to gain the distance L2 between the magnetic film 208 and the conductive substance just below the magnetic film 208 to reduce the thickness as shown in FIG. 9(c).

Figure 15:
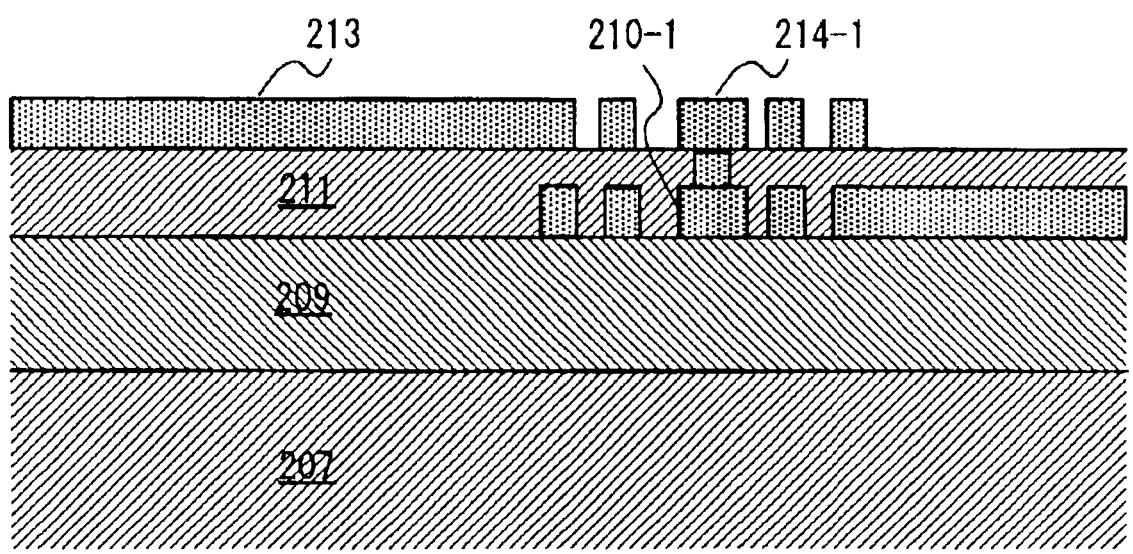
FIG. 15 is a diagram illustrating the details of a magnetic thin film non-loaded spiral inductor in a power amplifier module for a W-CDMA portable terminal according to the present invention.

In this embodiment, the matching coils L21 to L28 are formed of a magnetic thin film non-loaded two-layered spiral inductor, which can be formed by patterning a first inductor pattern 210-1 on the second polyimide layer 209, forming the third polyimide layer 211 thereon, and patterning a second inductor pattern 214-1 as shown in FIG. 15.

Figure 16:
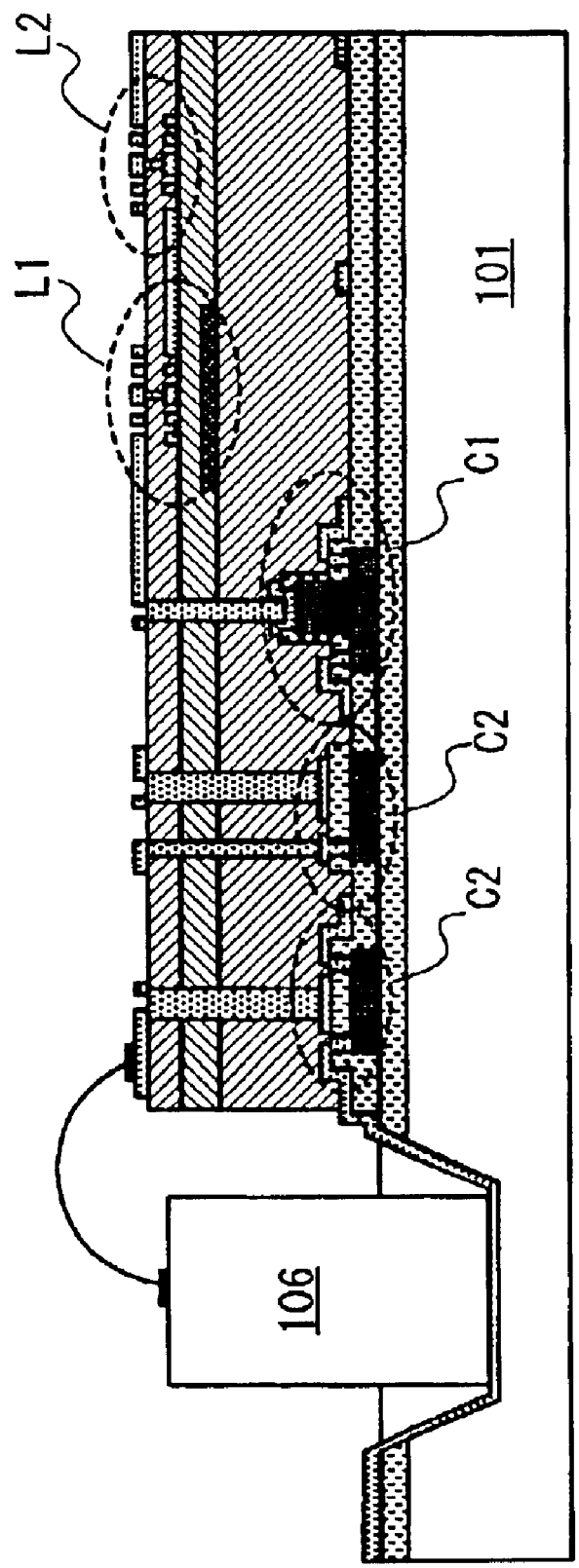
FIG. 16 is a diagram showing a positional relationship among a magnetic thin film loaded spiral inductor, a high-frequency high-capacity bypass capacitor, a matching capacitor and a matching coil of a power amplifier module for a W-CDMA portable terminal according to the present invention.
Figure 17:
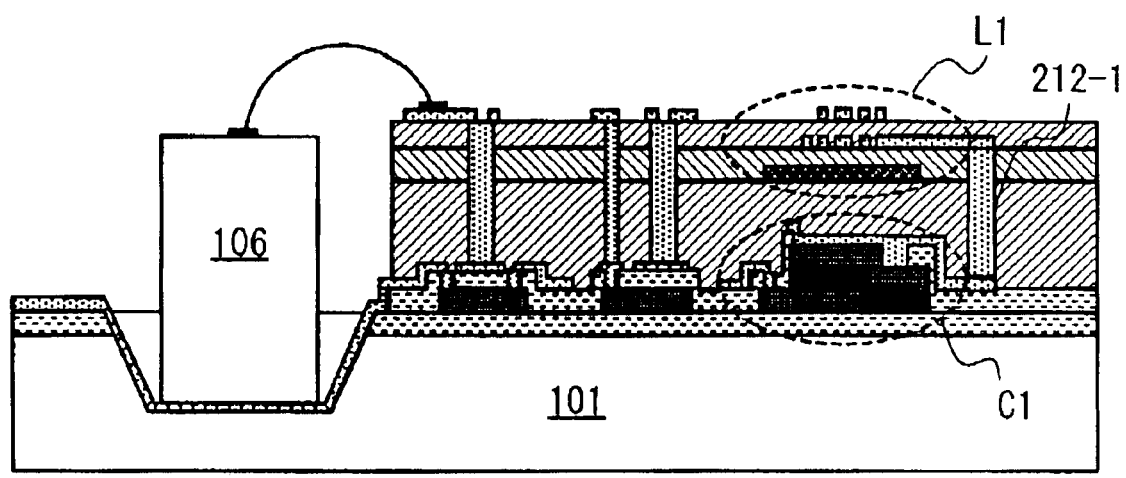
FIG. 17 is a diagram showing another positional relationship between a magnetic thin film loaded spiral inductor and a high-frequency high-capacity bypass capacitor portion in a power amplifier module for a W-CDMA portable terminal according to the present invention.

FIG. 16 is a diagram showing an example of the power amplifier module configured to include the matching coils L21 to L28.

In FIG. 16, C1 corresponds to the high-frequency high-capacity bypass capacitors C1, C12, C13, C14 shown in FIG. 2, C2 corresponds to the matching capacitors C21, C22, C23 shown in FIG. 2, L1 corresponds to the high-frequency choke coils L11, L12, L13, L14 shown in FIG. 2, and L2 corresponds to the matching coils L21 to L28 shown in FIG. 2.

Here, the high-frequency high-capacity bypass capacitor C1 and the high-frequency choke coil L1 configure a bias portion of the power amplifier module, and the matching capacitor C2 and the matching coil L2 configure a high-frequency portion of the power amplifier module.

In the configuration shown in FIG. 16, the high-frequency high-capacity bypass capacitor C1 and the high-frequency choke coil L1, which configure the bias portion, and the matching capacitor C2 and the matching coil L2, which configure the high-frequency portion, are displaced on the substrate 101 to separate the bias portion and the high-frequency portion from each other.

In the above embodiment, the magnetic thin film loaded spiral inductor and the magnetic thin film non-loaded spiral inductor are formed to have a two-layered structure of the first inductor pattern 210 (210-1) and the second inductor pattern 214 (214-1) but may be formed of a single-layered spiral inductor.

In the magnetic thin film loaded spiral inductor, the magnetic film 208 is disposed below the spiral inductor but may be disposed above the spiral inductor. The magnetic film may also be disposed above and below the spiral inductor to configure a magnetic thin film loaded spiral inductor having two magnetic films loaded.

In the above configuration, the magnetic thin film loaded spiral inductor is displaced from the high-frequency high-capacity bypass capacitor portion, but the magnetic thin film loaded spiral inductor L may be formed just above the high-frequency high-capacity bypass capacitor portion C as shown in FIG. 16.

Here, the high-frequency high-capacity bypass capacitor portion C1 and the magnetic thin film loaded spiral inductor L1 are mutually connected via a through hole 212-1. Thus, the substrate size can be reduced considerably.

Figure 18:
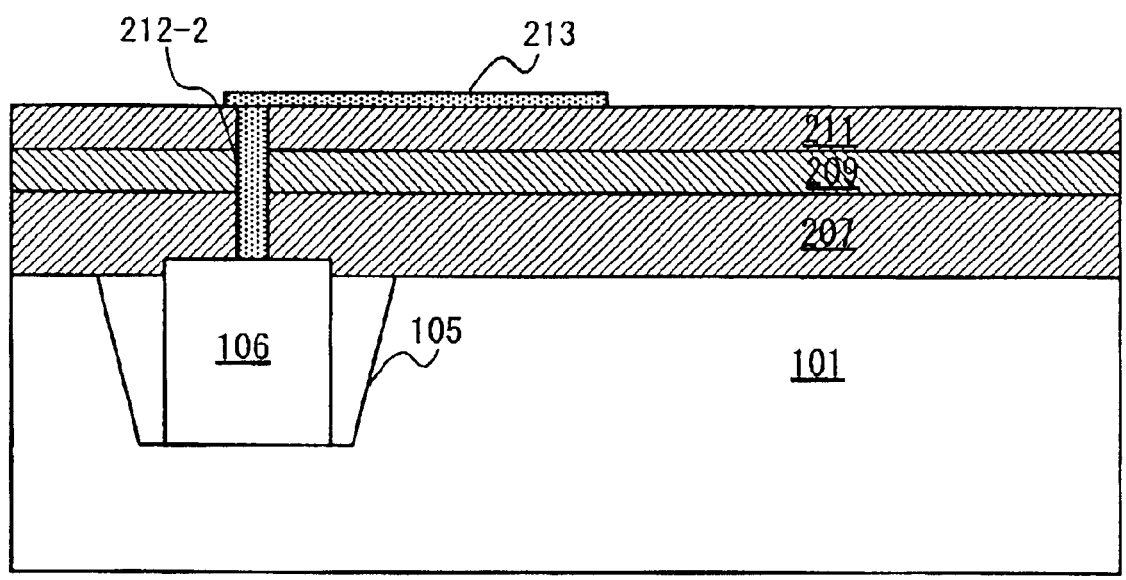
FIG. 18 is a diagram showing another example of connection between a high-frequency integrated circuit and an Al wiring layer in a power amplifier module for a W-CDMA portable terminal according to the present invention.
Figure 19:
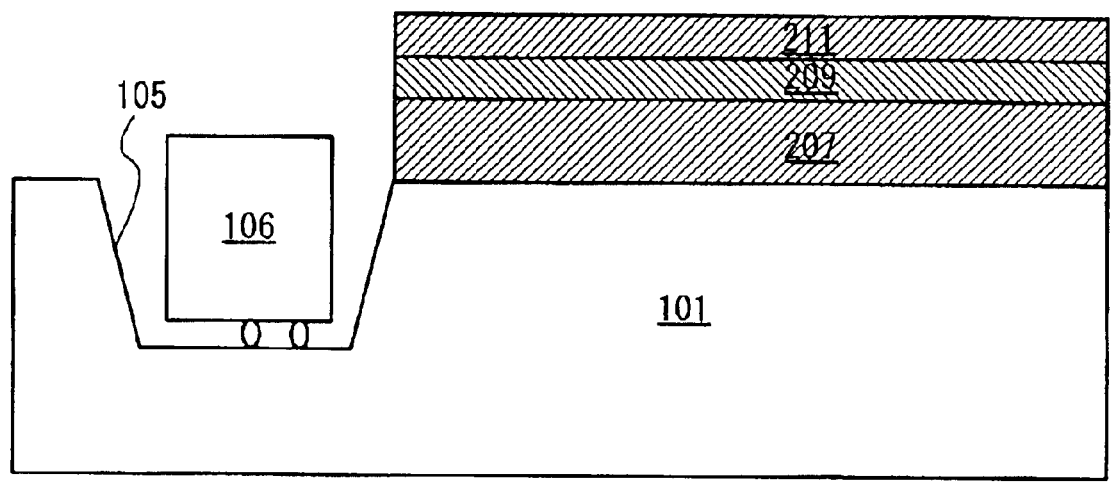
FIG. 19 is a diagram showing still another example of connection between a high-frequency integrated circuit and an Al wiring layer in a power amplifier module for a W-CDMA portable terminal according to the present invention.

In the above embodiment, the high-frequency integrated circuit 106 embedded in the counter sunk portion 105 and the Al wiring layer 213 are mutually connected by the wire bonding 215, but the high-frequency integrated circuit 106 embedded in the counter sunk portion 105 and the Al wiring layer 213 may be connected via a through hole 212-2 as shown in FIG. 18 or may be connected as a flip chip type as shown in FIG. 19.

Electronic parts which have multiple parts having variable functions mounted on a substrate are extensively used in a variety of fields and are demanded for improvement of various functions, such as multiple functions, miniaturization and low power consumption, for a wide range of uses.

An example of such electronic parts is described in Japanese Patent Application Laid-Open No. 2001-44778, in which an inductor and a capacitor are mounted on a substrate. This electronic part is produced by the following process as shown in FIGS. 20(a) to 20(c) and FIGS. 21(a) to 21(c).

Figure 20A:
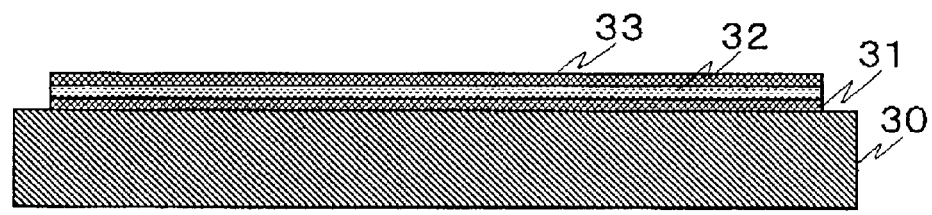
FIGS. 20(a) to 20(c) are sectional diagrams showing a process of producing a conventional composite module.

As shown in FIG. 20(a), a lower electrode 31 made of a conductive metal such as Pt, a dielectric layer 32 made of a ferroelectric material such as PZT (lead zirconate titanate), PST (lead scandate tantalate) or the like and an upper electrode 33 made of a conductive metal are stacked on an insulation substrate 30 made of $Al_2O_3$ or the like by sputtering or the like to form a capacitor.

Figure 20B:
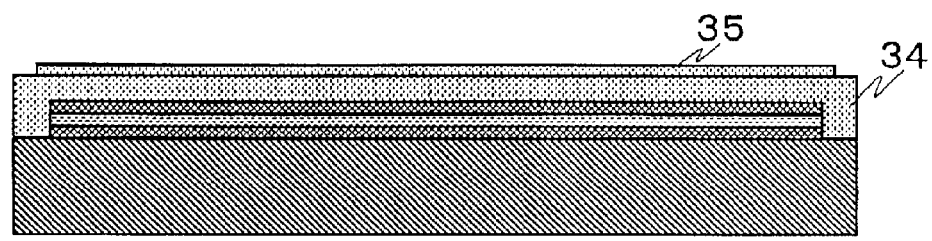
Figure 20C:
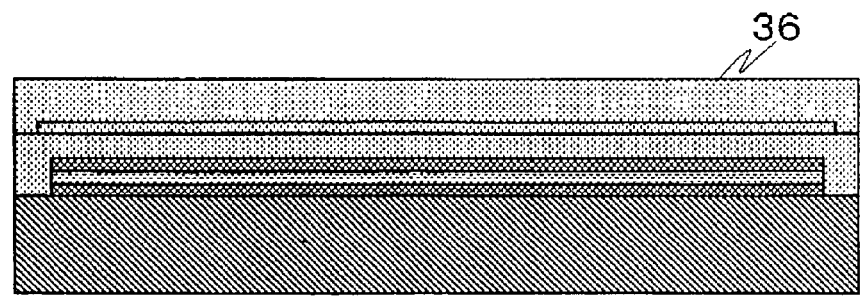

Then, a first insulation layer 34 is formed using an insulating material such as polyimide, and a magnetic film 35 is formed using a ferromagnetic material such as CoTaHfPd on the insulation layer 34 as shown in FIG. 20(b). A second insulation layer 36 is then formed using an insulating material on the magnetic film 35 as shown in FIG. 20(c).

Figure 21A:
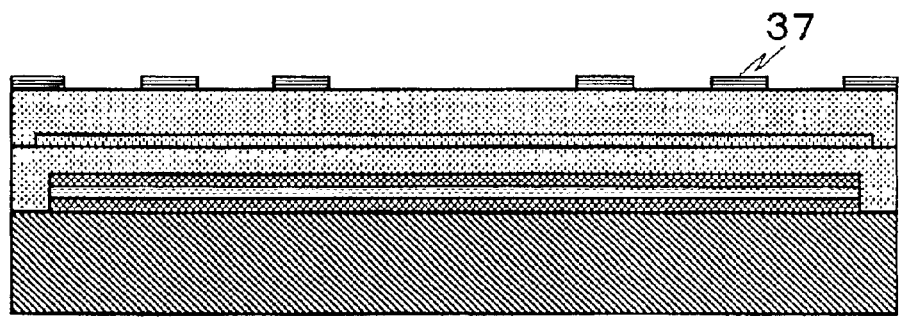
FIGS. 21(a) to 21(c) are sectional diagram showing the process of producing the conventional composite module.
Figure 21B:
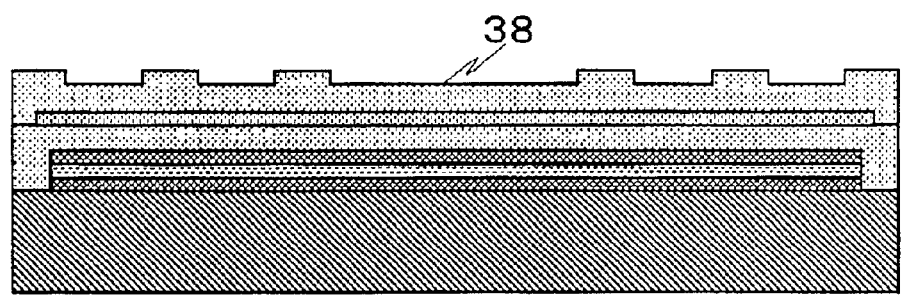

Here, photosensitive polyimide or the like is applied onto the second insulation layer 36 and patterned to form a resist 37 as shown in FIG. 21(a). And, a coil-shape mold 38 is formed by patterning with the resist 37 used as a mask, and the resist 37 is removed as shown in FIG. 21(b).

Figure 21C:
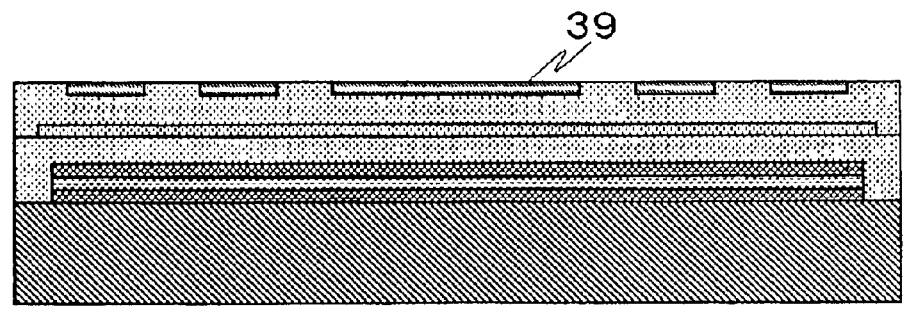

As shown in FIG. 21(c), the coil-shape mold 38 is plated with a metal such as copper by electrolytic plating to form a coil-shape metal plating layer 39 (inductor).

Various mobile communication terminals such as a portable telephone, a PDA (Personal Digital Assistant) and the like are indispensable for our daily life in recent years and being made to be multifunctional, compact and low in power consumption.

Along with the above situation, the high-frequency module such as a power amplifier which is a main part of such terminals is demanded to be made higher in frequency and an additional decrease in size, power consumption and price. And, there is being proposed a method to incorporate conventional various parts, such as an inductor, a capacitor and the like which are mounted on the substrate to configure a high-frequency module, as elements on the substrate.

But, when the high frequency module such as a power amplifier is formed by the method described in Japanese Patent Application Laid-Open No. 2001-44778 described with reference to the drawings, the following problems are caused.

The high-frequency magnetic film represented by a nanogranular magnetic thin film is generally conductive. When it is loaded on an inductor to confine a magnetic flux so to increase inductance, they are coupled electromagnetically, resulting in a loss.

Figure 22A:
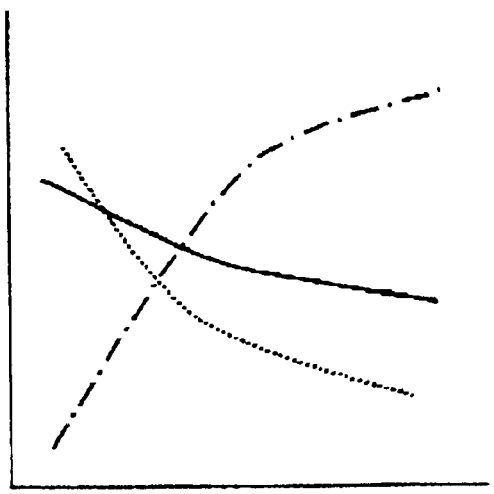
FIGS. 22(a) and 22(b) are graphs showing a change in resonant frequency, loss and inductance involved in a change of distance between a magnetic film and an inductor or conductive substance.

Generally, when a distance between the inductor and the magnetic film decreases, an amount of confined magnetic flux increases, the inductance increases, but the loss also increases and a resonant frequency lowers, and when the distance between the inductor and the magnetic film increases, the loss decreases, the resonant frequency increases, but an effect of loading becomes small as shown in FIG. 22(a).

Therefore, it is necessary to optimize the distance between the inductor and the magnetic film by finely controlling depending on a target used and specifications.

But, the method using etching described above with reference to FIGS. 20(a) to 20(c) and FIGS. 21(a) to 21(c) forms a mold having an accurate and uniform depth in an insulation layer with difficulty, and therefore it is hard to accurately control a distance between the inductor and the magnetic film. Besides, the module is demanded to be smaller, and this miniaturization makes it more difficult to finely control the distance between the inductor and the magnetic film.

The same phenomenon as the above-described phenomenon caused between the inductor and the magnetic film also occurs between the magnetic film and the conductive substance (corresponding to the electrode here) just below it.

And, the module such as a high-frequency module generally uses silicon or the like for the substrate. Therefore, the same phenomenon as that caused between the inductor and the magnetic film occurs between the magnetic film and the substrate just below it.

Figure 22B:
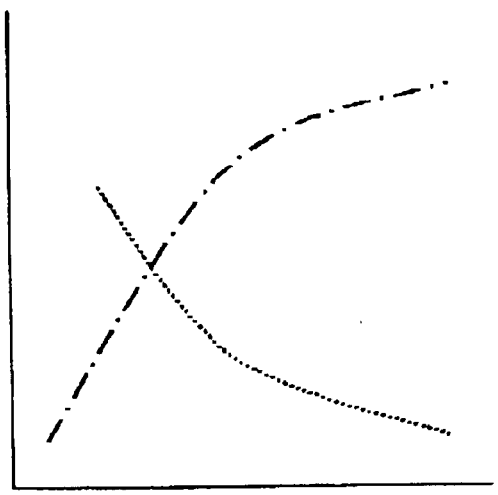

The phenomenon occurred between the magnetic film and the conductive substance just below it has unidirectionality that a loss increases as the distance between the magnetic film and the conductive substance becomes smaller and decreases when the resonant frequency lowers and the distance between the magnetic film and the conductive substance increases, resulting in saturation as shown in FIG. 22(b).

But, the module has an increased thickness as the distance between the magnetic film and the conductive substance increases. It is not desirable as a process, and it is necessary to find an optimum position.

Thus, for a compact composite module having a capacitor and an inductor, such as a high-frequency module, it is necessary to accurately control a distance between the inductor and the magnetic film and a distance between the magnetic film and the conductive substance just below it.

Figure 23:
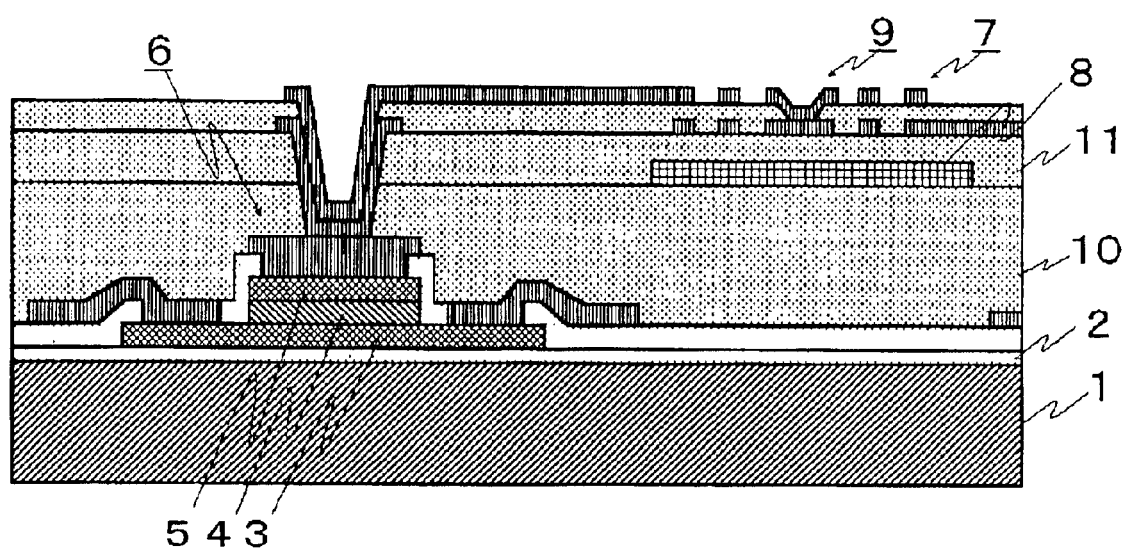
FIG. 23 is a sectional diagram showing another embodiment of the composite module according to the present invention.

FIG. 23 is a sectional diagram showing another embodiment of the composite module according to the present invention, and FIGS. 24(a) to 24(e) and FIGS. 25(a) to 25(c) are sectional diagrams showing a production process of the composite module of this embodiment.

As shown in FIG. 23, the composite module according to this embodiment has therein disposed a capacitor 6 which is formed of a lower electrode 3 mounted on a semiconductor substrate 1 with a first insulation layer 2 between them, a dielectric film 4 and an upper electrode 5, and an inductor 9 which is formed of a coil 7 having a coil pattern with wiring formed into a coil pattern and a magnetic film 8 made of a magnetic material.

The inductor 9 is disposed above the capacitor 6, the capacitor 6 and the inductor 9 are displaced so not to overlap with respect to the surface of the semiconductor substrate 1 on which the capacitor 6 and the inductor 9 are disposed.

A first interlayer insulation film 10 is disposed between the semiconductor substrate 1 and the magnetic film 8, and a second interlayer insulation film 11 is disposed between the magnetic film 8 and the coil 7.

An element made of a conductive material such as wiring is not disposed between the inductor 9 and the substrate 1. The conductive material just below the magnetic film 8 is the substrate.

Thus, the composite module according to this embodiment has the inductor and the capacitor disposed at different positions so not to overlap with respect to the surface of the semiconductor substrate, and because only an insulation material is disposed between the magnetic film and the substrate, a distance between the magnetic film and the conductor just below it is a distance between the magnetic film and the semiconductor substrate. Thus, the composite module can be made thin.

The distance between the magnetic film and the substrate is adequately secured using the first interlayer insulation film to provide an appropriate distance between the inductor and the semiconductor substrate and also to secure an appropriate distance between the inductor and the capacitor formed on the surface of the semiconductor substrate with the first insulation film between them, and interference between the inductor and the capacitor can be prevented.

Then, the production process of the composite module according to this embodiment will be described with reference to FIG. 24(a) to FIG. 24(e) and FIG. 25(a) to FIG. 25(c).

Figure 24A:
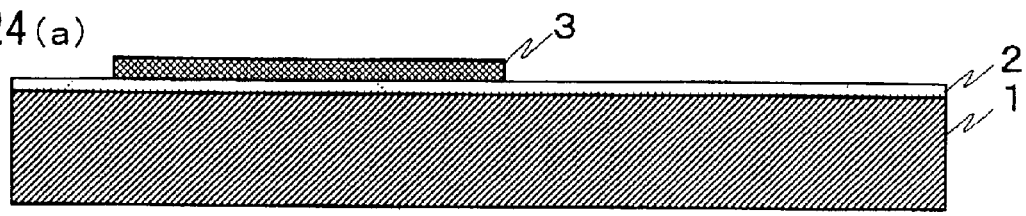
FIGS. 24(a) to 24(e) are sectional diagrams showing a process of producing the composite module shown in FIG. 23.

First, as shown in FIG. 24(a), the first insulation layer 2 made of silicon oxide is formed on the surface of the semiconductor substrate 1 made of silicon, and a platinum electrode is formed as the lower electrode 3 at a prescribed position by sputtering.

Figure 24B:
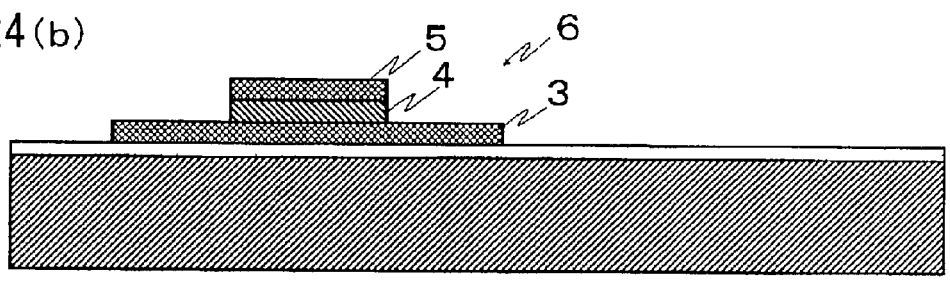

As shown in FIG. 24(b), an STO ($SrTiO_3$) is grown on the lower electrode 3 to form the dielectric film 4, and the platinum electrode which forms the upper electrode 5 is formed on the dielectric film 4 to form the capacitor 6.

Figure 24C:
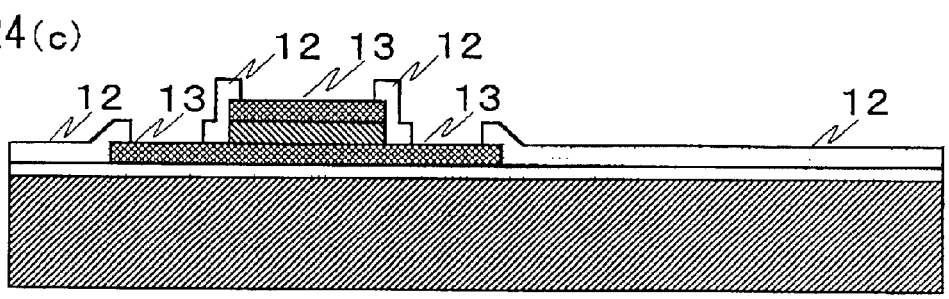

A second insulation layer 12 made of a silicon oxide film is formed on the semiconductor substrate having the upper and lower electrodes formed and selectively etched to form first openings 13 which reveal at least a part of the upper electrode 5 as shown in FIG. 24(c).

Figure 24D:
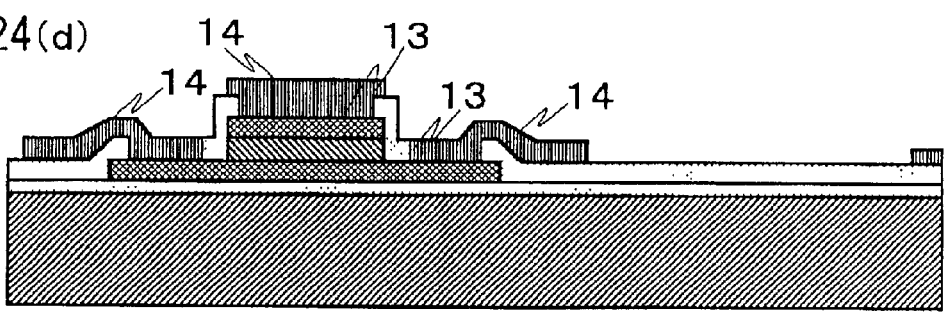

Here, first wiring 14 of aluminum is formed in the first openings 13 and at prescribed positions by sputtering as shown in FIG. 24(d). This wiring is formed at a position different from the portion corresponding to the position where the inductor is formed later with respect to the surface of the semiconductor substrate.

Figure 24E:
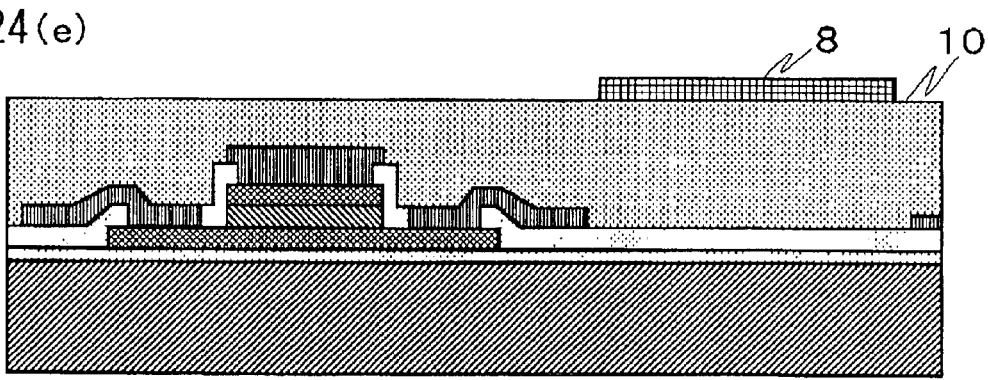

And, polyimide is applied to form the first interlayer insulation layer 10, and the magnetic film 8 made of the nanogranular magnetic substance is formed at a prescribed position on the first interlayer insulation film 10 as shown in FIG. 24(e).

Here, the first interlayer insulation film 10 is formed to have a thickness to provide an optimum distance between the semiconductor substrate 1 and the magnetic film 8, and no element made of a conductive material such as wiring or an electrode is disposed between the magnetic film 8 and the semiconductor substrate 1.

Polyimide is applied onto the first interlayer insulation film 10 and the magnetic film 8 to form the second interlayer insulation film 11, and the first interlayer insulation layer 10 and the second interlayer insulation 11 are selectively etched to form a second opening 15 which reveals at least a part of the first wiring 14 formed on the first opening 13.

Figure 25A:
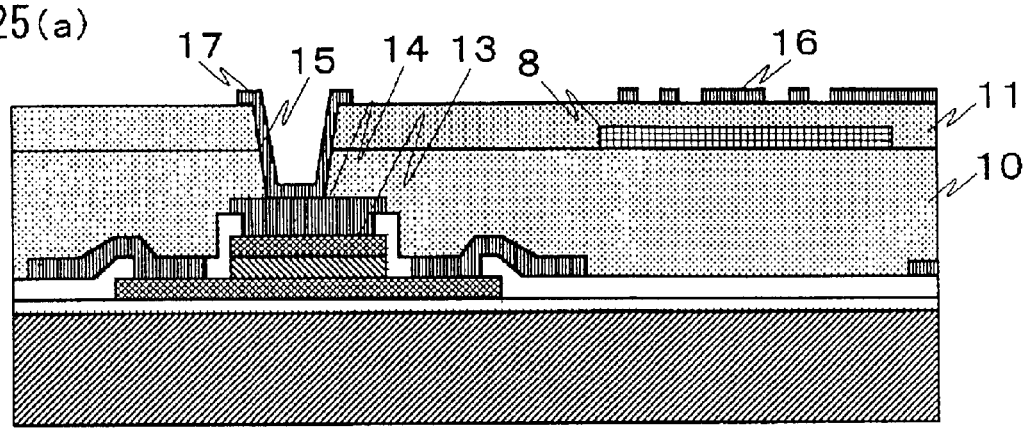
FIGS. 25(a) to 25(c) are sectional diagrams showing the process of producing the composite module shown in FIG. 23.

And, sputtering is performed to form a first coil pattern 16 made of aluminum on the second interlayer insulation film 11 above the magnetic film 8, and a first connection layer 17 is formed on the second opening 15 as shown in FIG. 25(a).

The second interlayer insulation film 11 is formed to have a thickness so to have an appropriate distance between the magnetic film 8 and the first coil pattern 16.

Figure 25B:
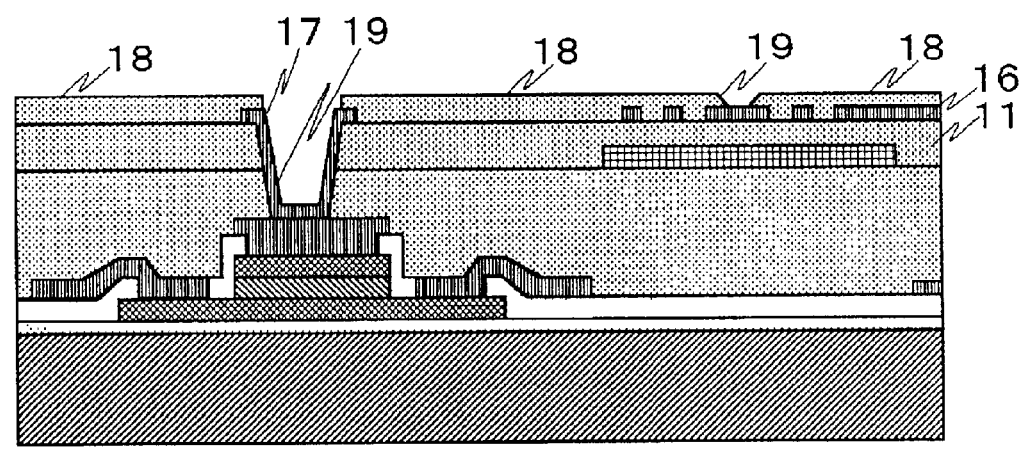

Here, polyimide is applied onto the second interlayer insulation film 11, the first coil pattern 16 and the first connection layer 17 to form a third interlayer insulation film 18. Selective etching is performed to form a third opening 19 which reveals at least a part of the coil pattern 16 and the first connection layer 17 as shown in FIG. 25(b).

Figure 25C:
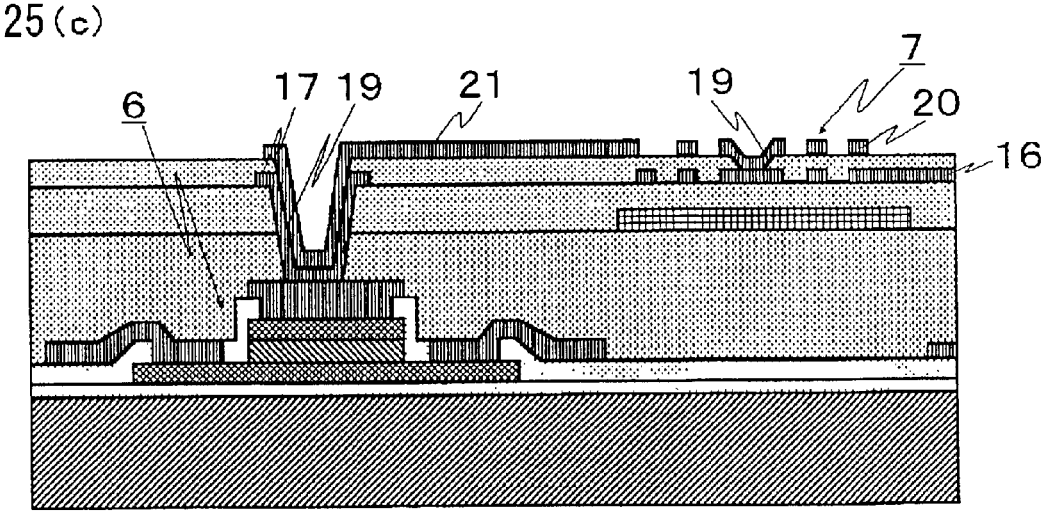

And, sputtering is performed using a conductive material such as aluminum to form a second coil pattern 20 which is connected to the first coil pattern 16 via the third opening 19 as shown in FIG. 25(c) so to form the coil 7 which is formed of the first coil pattern 16 and the second coil pattern 20 and a second connection layer 21 which is connected to the first connection layer 17 via the third opening 19.

Here, the capacitor 6 and the coil 7 are mutually connected via the first connection layer 17 and the second connection layer 21.

Thus, for the composite module of this embodiment, the distance between the substrate and the magnetic film or between the magnetic film and the inductor is controlled by controlling the thickness of the first and second interlayer insulation layer when they are formed. Thus, each distance can be controlled easily and accurately.

Because the capacitor and the inductor are disposed not to overlap mutually with respect to the substrate plane, the distance between the substrate and the magnetic layer can be a required minimum distance, and the composite module can be made thin.

Besides, because the inductor and the capacitor are formed at difference positions with respect to the substrate plane and the distance between the substrate and the magnetic film is appropriate, the distance between the capacitor and the inductor increases, and the interference between the inductor and the capacitor can be prevented.

In addition, the plane size of the coil is limited by the area of the magnetic film, but the formation of the inductor by connecting the first coil and the second coil can increase an inductance value of the inductor within a prescribed area.

Figure 26A:
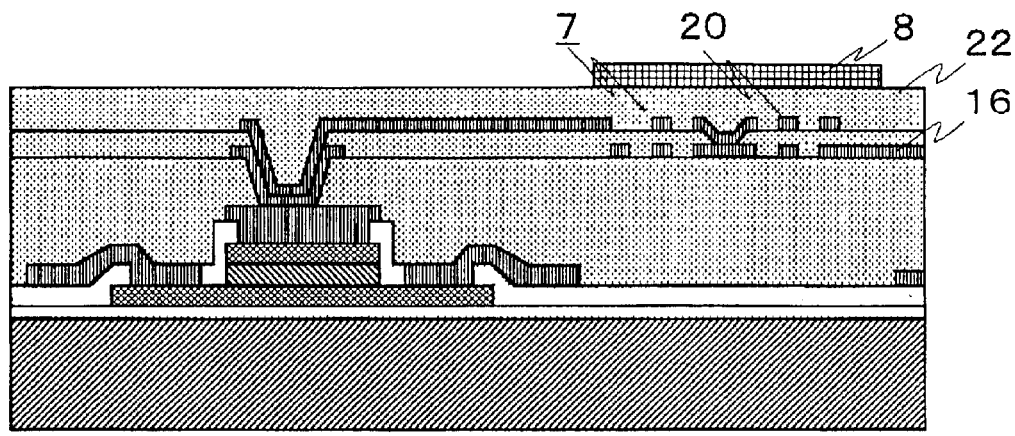
FIGS. 26(a) and 26(b) are sectional diagrams showing an example of another structure of the composite module according to this embodiment.

In this embodiment, the magnetic film is formed between the inductor and the substrate, but the magnetic film 8 can be formed above the inductor 9 as shown in FIG. 26(a).

The fourth interlayer insulation layer 22 to be formed between the second coil pattern 20 and the magnetic film 8 is formed to have a thickness so as to provide an appropriate distance between the coil 7 and the magnetic film 8.

Figure 26B:
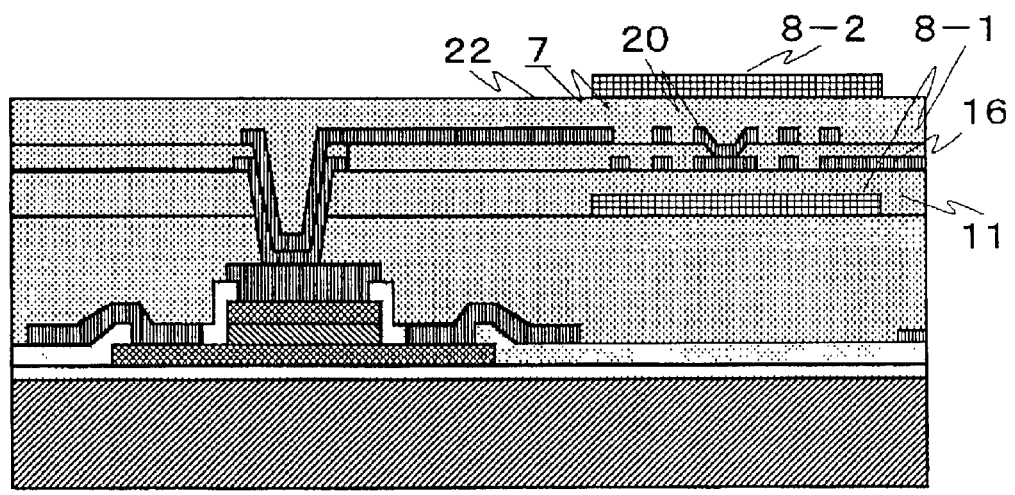

As shown in FIG. 26(b), the magnetic film can be formed above and below the inductor, and the second interlayer insulation film 11 to be formed between the first coil pattern 16 and a magnetic film 8-1 is formed to have a thickness so to provide an appropriate distance between the coil 7 and the magnetic film 8-1. And, the fourth interlayer insulation film 22 to be formed between the second coil pattern 20 and a magnetic film 8-2 is formed to have a thickness so to provide an appropriate distance between the coil 7 and the magnetic film 8-2.

Figure 27A:
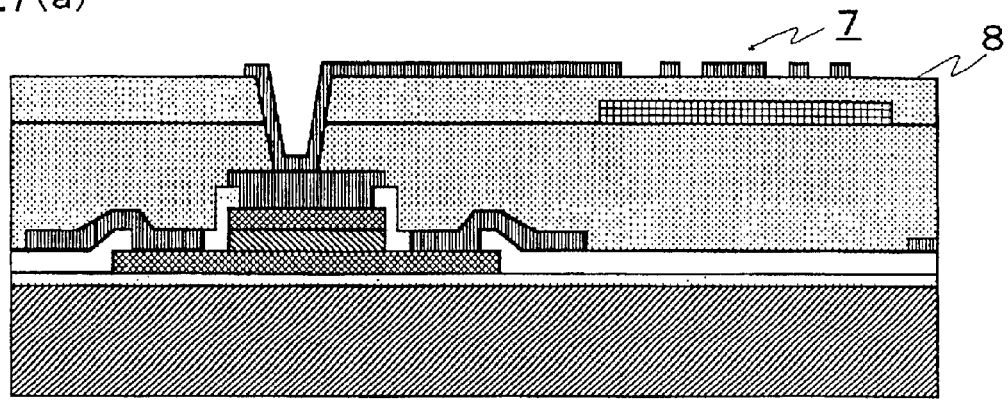
FIGS. 27(a) to 27(c) are sectional diagrams showing an example of another structure of the composite module according to this embodiment.
Figure 27B:
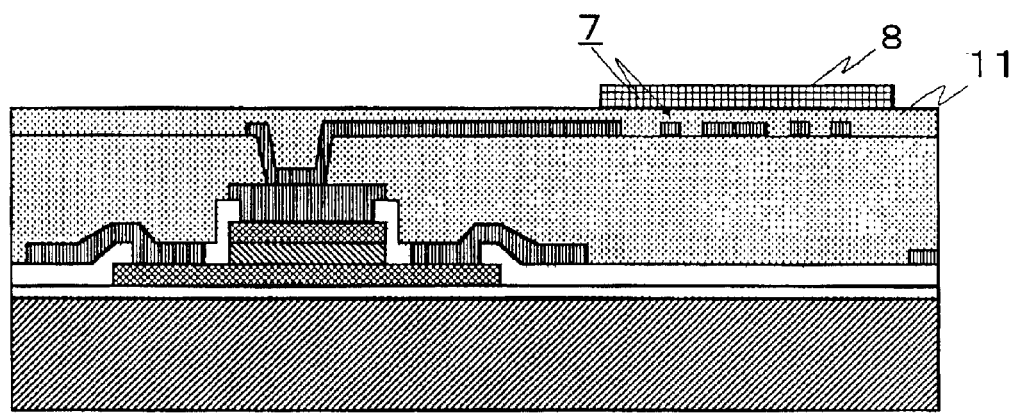
Figure 27C:
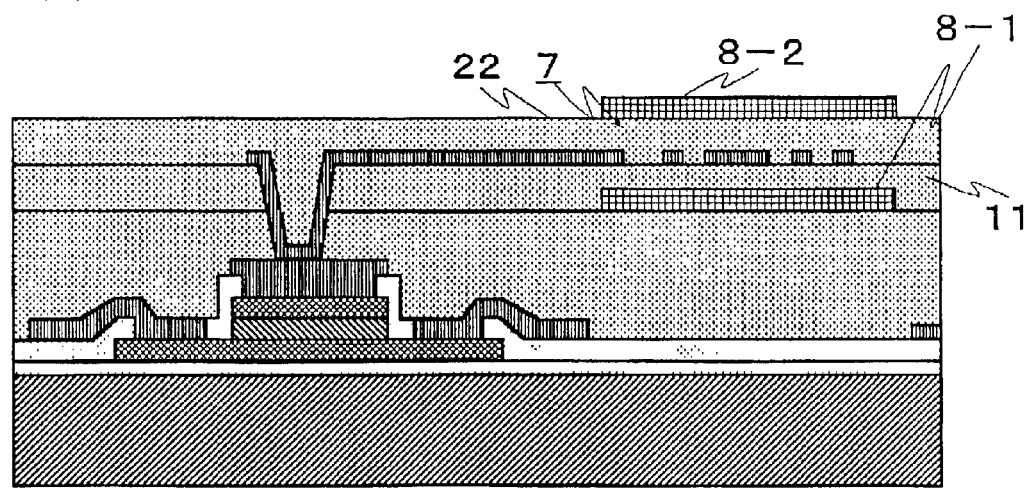

In this embodiment, the coil of the inductor is formed by connecting the first coil pattern and the second coil pattern formed by sputtering, but the coil of the inductor can also be formed using one coil pattern as shown in FIG. 27(a) to FIG. 27(c). Thus, the module can be formed thinner.

Figure 28:
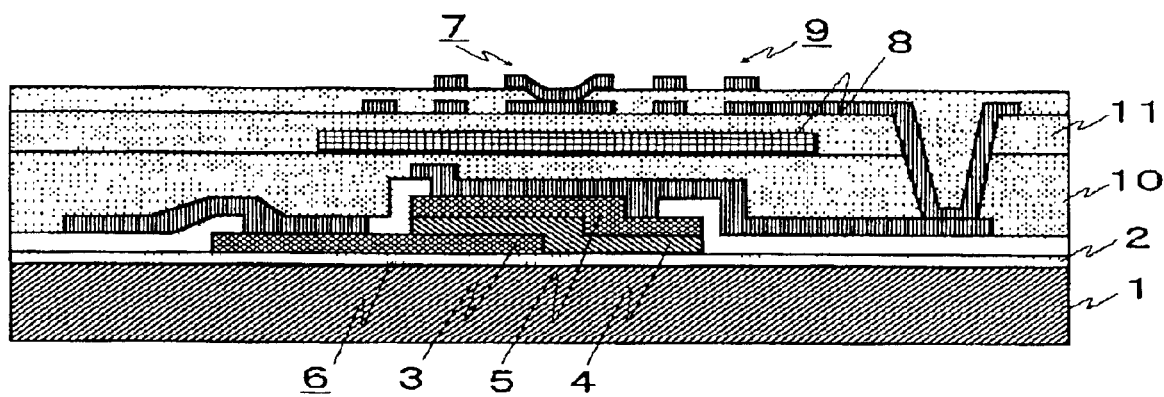
FIG. 28 is a sectional diagram showing another embodiment of the composite module according to the present invention.

FIG. 28 is a sectional diagram showing still another embodiment of the composite module according to the present invention, and FIG. 28 and FIG. 29(a) to FIG. 29(d) are sectional diagrams showing a production process of the composite module of this embodiment. In this embodiment, the same reference numerals as those used in FIG. 23 top FIGS. 27(a) to 27(c) are used to indicate components which have the same functions as those of the embodiment shown in FIG. 23 to FIGS. 27(a) to 27(c) for convenience in describing.

As shown in FIG. 28, the composite module according to this embodiment has therein disposed a capacitor 6 which is formed of a lower electrode 3 mounted on a semiconductor substrate 1 with a first insulation layer 2 between them, a dielectric film 4 and an upper electrode 5, and an inductor 9 which is formed of a coil 7 having a coil pattern with wiring formed into a coil pattern and a magnetic film 8 made of a magnetic material.

And, the inductor 9 is disposed above the capacitor 6 so to have the capacitor 6 and the inductor 9 overlapped with respect to the surface of the semiconductor substrate 1 on which the capacitor 6 and the inductor 9 are disposed.

A first interlayer insulation film 10 is disposed between the semiconductor substrate 1 and the magnetic film 8, and a second interlayer insulation film 11 is disposed between the magnetic film 8 and the coil 7.

Thus, the composite module according to this embodiment has the inductor and the capacitor disposed so to partly overlap in a vertical direction with respect to the plane of the semiconductor substrate. Therefore, the composite module can be formed in a small area.

And, because the appropriate distance is secured between the magnetic film and the semiconductor substrate by the first interlayer insulation film, an appropriate distance is provided between the inductor and the semiconductor substrate, and interference between the inductor and the capacitor can be prevented.

A production process of the composite module of this embodiment will be described with reference to FIGS. 29(a) to 29(d) and FIGS. 30(a) to 30(c).

First, the first insulation layer 2 of silicon oxide is formed on the surface of the semiconductor substrate 1 which is made of silicon, and a platinum electrode is formed as the lower electrode 3 at a prescribed position by sputtering.

Figure 29A:
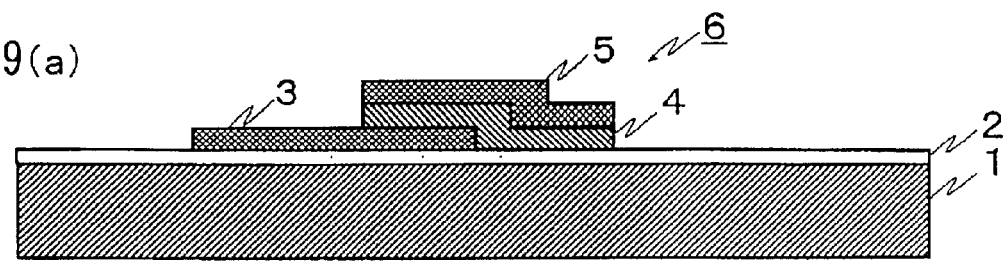
FIGS. 29(a) to 29(d) are sectional diagrams showing a process of producing the composite module shown in FIG. 28.

An STO ($SrTiO_3$) is grown on the lower electrode 3 to form the dielectric film 4, and a platinum electrode which forms the upper electrode 5 is formed on the dielectric film 4 so to form the capacitor 6 which is formed of the lower electrode 3, the dielectric film 4 and the upper electrode 5 as shown in FIG. 29(a).

Figure 29B:
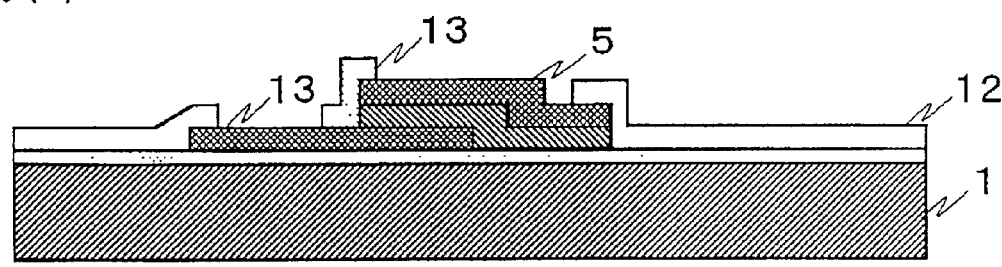

The second insulation layer 12 of a silicon oxide film is formed on the upper electrode 5 and the semiconductor substrate on which the lower electrode 3 is formed, and the second insulation layer 12 is selectively etched to form the first opening 13 which reveals at least a part of the upper electrode 5 as shown in FIG. 29(b).

Figure 29C:
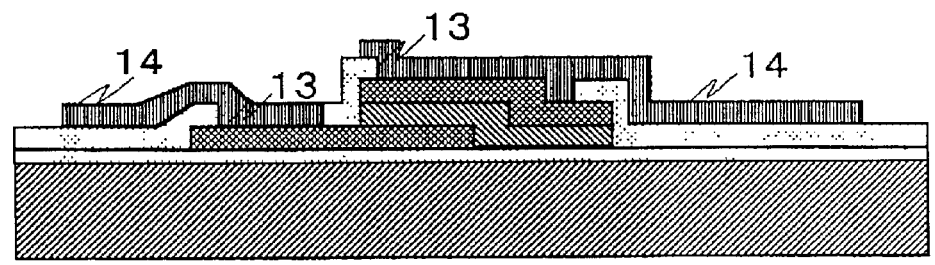

Here, sputtering and patterning are performed to form the first wiring 14 of aluminum in the opening 13 and at a prescribed position as shown in FIG. 29(c).

Figure 29D:
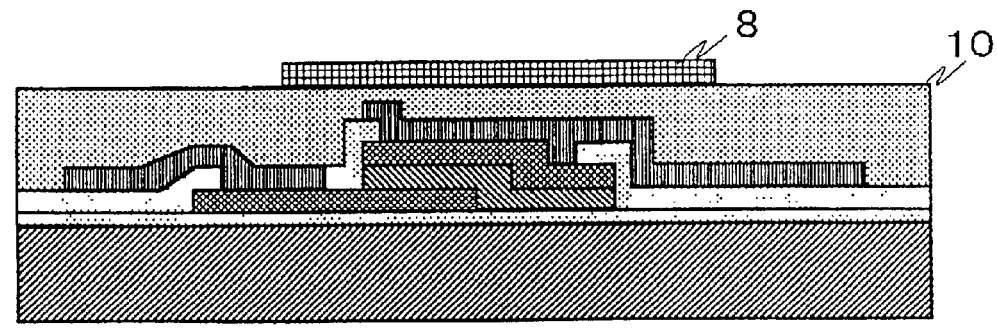

Polyimide is applied to form the first interlayer insulation layer 10, and the magnetic film 8 of a nanogranular magnetic substance is formed at a prescribed position on the first interlayer insulation film 10 as shown in FIG. 29(d).

The first interlayer insulation film 10 is formed to have a thickness so to provide an appropriate distance between the semiconductor substrate 1 and the magnetic film 8.

Figure 30A:
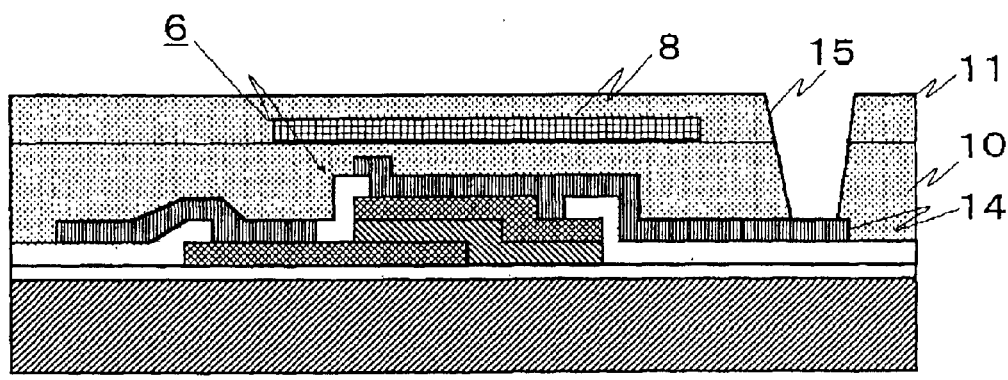
FIGS. 30(a) to 30(c) are sectional diagrams showing the process of producing the composite module shown in FIG. 28.

Polyimide is applied to the first interlayer insulation layer 10 and the magnetic film 8 to form the second interlayer insulation film 11, and etching is performed at a prescribed position to form the second opening 15 which reveals at least a part of the first wiring 14 formed on the capacitor 6 as shown in FIG. 30(a).

Figure 30B:
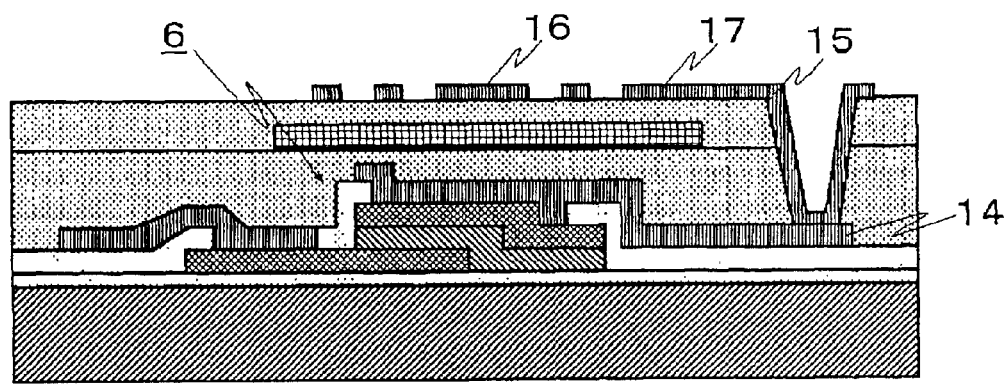

Then, sputtering and patterning are performed to form the first coil pattern 16 and the connection layer 17, which connects the capacitor 6 and the first coil pattern 16 via the first wiring 14, in the second opening 15 as shown in FIG. 30(b).

Here, polyimide is applied to the second interlayer insulation layer 11, the first coil pattern 16 and the connection layer 17 to form the third interlayer insulation 18, and etching is performed at a prescribed position to form the third opening 19 which reveals at least a part of the first coil pattern 16.

Figure 30C:
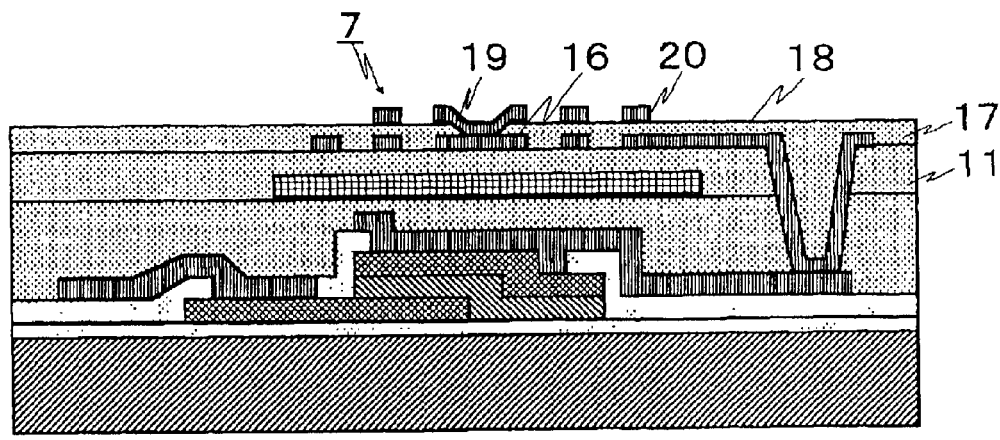

Sputtering and patterning are performed using a conductive material such as aluminum on the third interlayer insulation film 18 and the third opening 19 to form the second coil pattern 20 which is connected to the first coil pattern 16 via the third opening 19 so to form the coil 7 which is formed of the first coil pattern 16 and the second oil pattern 20 as shown in FIG. 30(c).

Thus, for the composite module of this embodiment, when the insulation layer is formed, its thickness is controlled to control a distance between the substrate and the magnetic film or between the magnetic film and the inductor. Thus, the distance can be controlled easily and accurately.

Because the capacitor and the inductor are disposed in a vertical direction with respect to the plane of the substrate so that they are partly overlapped, the composite module can be formed in a small area.

Besides, the gap between the coil and the magnetic film can be controlled appropriately by adjusting the thickness of the second interlayer insulation layer.

And, the gap between the magnetic film and the capacitor can be made to have an appropriate distance by controlling the thickness of the first interlayer insulation layer, and interference between the inductor and the capacitor can be prevented.

In addition, the plane size of the coil is limited by the area of the magnetic film, but an inductance value of the inductor can be increased within a prescribed area by connecting the first coil and the second coil to form the inductor.

Figure 31A:
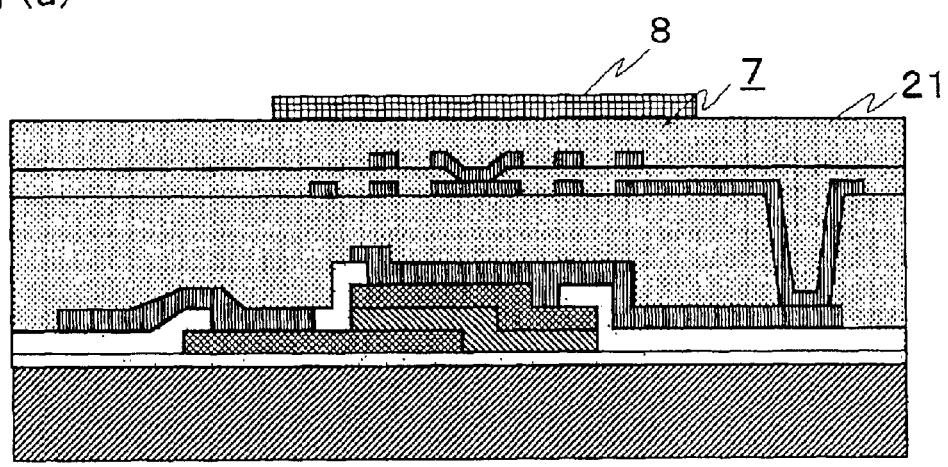
FIGS. 31(a) and 31(b) are sectional diagrams showing an example of another structure of the composite module according to this embodiment.

In this embodiment, the magnetic film is formed between the coil of the inductor and the substrate, but the magnetic film 8 can be formed above the coil 7 as shown in FIG. 31(a).

At this time, the fourth interlayer insulation film 21 to be formed between the second coil pattern 20 and the magnetic film 8 is formed to have a thickness to provide an appropriate distance between the coil 7 and the magnetic film 8.

Figure 31B:
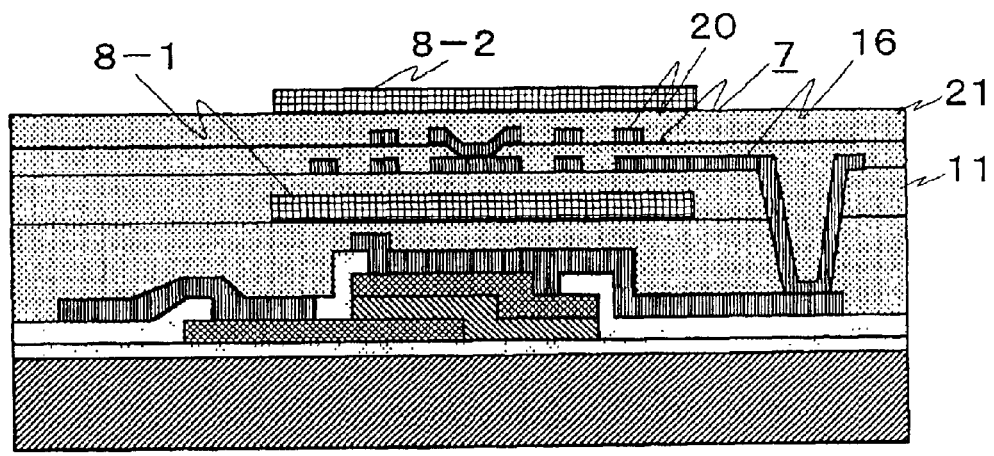

As shown in FIG. 31(b), the magnetic film 8 can also be formed above and below the coil 7. And, the second interlayer insulation film 11 to be formed between the first coil pattern 16 and the magnetic film 8-1 is formed to have a thickness to provide an appropriate distance between the coil 7 and the magnetic film 8-1, and the fourth interlayer insulation film 21 to be formed between the second coil pattern 20 and the magnetic film 8-2 is formed to have a thickness to provide an appropriate distance between the coil 7 and the magnetic film 8-2.

Figure 32A:
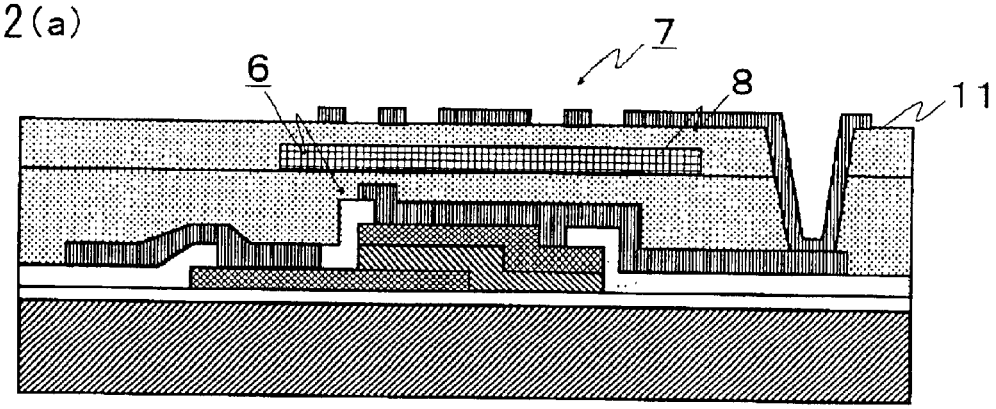
FIGS. 32(a) to 32(c) are sectional diagrams showing an example of another structure of the composite module according to this embodiment.
Figure 32B:
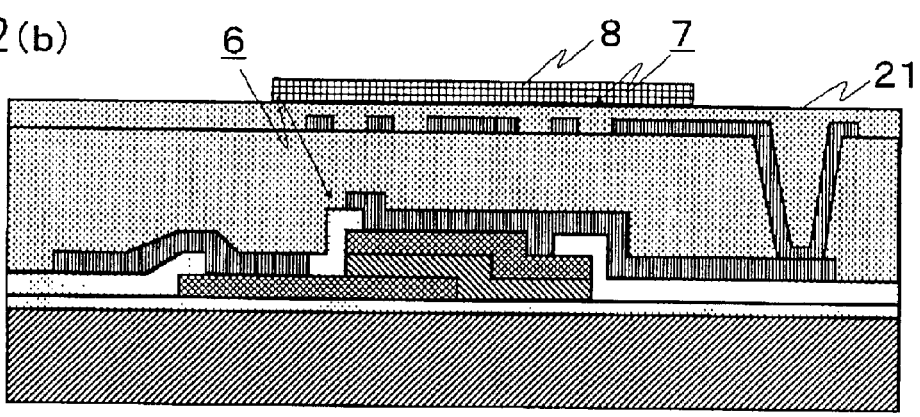
Figure 32C:
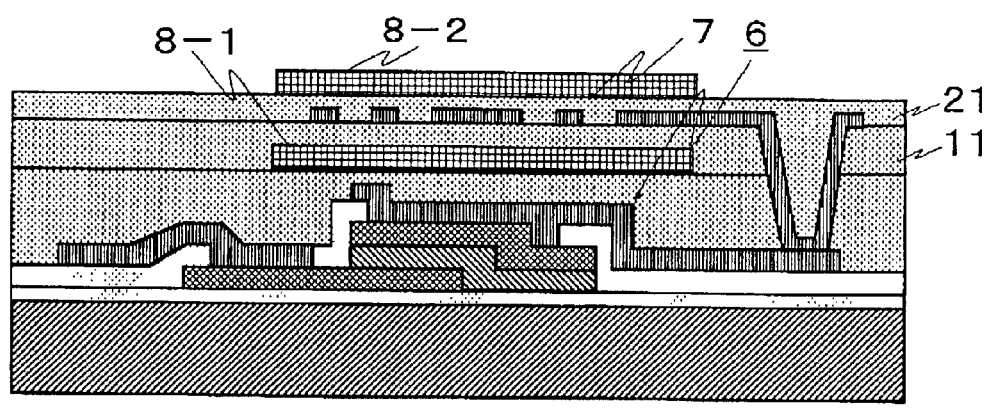

In this embodiment, the coil of the inductor is formed by connecting the first coil pattern and the second coil pattern formed by sputtering and patterning, but the coil of the inductor can also be formed using one coil pattern as shown in FIGS. 32(a) to 32(c). Thus, the module can be made thinner.

What is claimed is:

1. A composite module, comprising:
   a substrate;
   a capacitor which is formed by stacking thin films of different types of materials on the substrate;
   a first wiring layer which is formed on the capacitor;
   a first interlayer insulation film which is formed on the first wiring layer;
   a magnetic film which is formed on the first interlayer insulation film;
   a second interlayer insulation film which is formed on the magnetic film;
   a first inductor pattern which is formed on the second interlayer insulation film;
   a third interlayer insulation film which is formed on the second interlayer insulation film;
   a second inductor pattern which is formed on the third interlayer insulation film to partly overlap with the first inductor pattern;
   a second wiring layer which is formed on the third interlayer insulation film; and
   a high-frequency integrated circuit which is connected to the first wiring layer and to the second wiring layer and mounted on the substrate.

2. The composite module according to claim 1, wherein the capacitor is formed of an MIM capacitor having a $Pt/SrTiO_3/Pt$ structure and functions as a high-frequency high-capacity bypass capacitor.

3. The composite module according to claim 1, wherein the capacitor is formed of an MIM capacitor having $SiO_2$ as a dielectric substance and functions as a matching low-capacity capacitor.

4. The composite module according to claim 1, wherein the first inductor pattern and the second inductor pattern are formed to partly overlap with the magnetic film to configure a two-layered magnetic thin film loaded inductor which confines magnetic flux by the magnetic film and functions as a high-frequency choke coil.

5. The composite module according to claim 1, wherein:
   a distance between the first inductor pattern and the magnetic film is determined by a thickness of the second interlayer insulation film, and
   a distance between the second inductor pattern and the first inductor pattern is determined by a thickness of the third interlayer insulation film.

6. The composite module according to claim 4, wherein the magnetic film is made of a nanogranular magnetic thin film.

7. The composite module according to claim 4, wherein:
   the magnetic thin film loaded inductor is formed at a position different from the capacitor, and
   the first wiring layer is removed at the position where the magnetic thin film loaded inductor is formed.

8. The composite module according to claim 4, wherein the magnetic thin film loaded inductor is stacked on the capacitor.

9. The composite module according to claim 1, wherein:
   the capacitor includes a high-frequency high-capacity bypass capacitor configuring a bias section and a matching capacitor configuring a high-frequency section;
   the magnetic film, the first inductor pattern and the second inductor pattern function as a magnetic thin film loaded inductor which configures a bias section;
   a matching inductor which configures a high frequency section is further formed on the substrate; and
   the bias section including the high frequency high-capacity bypass capacitor and the magnetic thin film loaded inductor and the high-frequency section including the matching capacitor and the matching inductor are disposed on the substrate with their positions displaced from each other.

10. The composite module according to claim 1, wherein the substrate is made of a high-resistance silicon substrate.

11. The composite module according to claim 1, wherein the first to third interlayer insulation films are made of polyimide and have a total thickness of 15 μm or more.

12. The composite module according to claim 1, wherein the high-frequency integrated circuit is made of a GaAs MMIC, and the GaAs MMIC configures an active element of a power amplifier.

13. The composite module according to claim 1, wherein the substrate has a counter sunk portion, and the high-frequency integrated circuit is mounted in the counter sunk portion.

14. The composite module according to claim 1, wherein the high-frequency integrated circuit is connected to the second wiring layer via a bonding wire.

15. The composite module according to claim 1, wherein the high-frequency integrated circuit is connected to the second wiring layer via through holes formed in the first to third interlayer insulation films.

16. The composite module according to claim 1, wherein the high-frequency integrated circuit is connected as a flip chip type to the second wiring layer.

17. A composite module, comprising:

a capacitor formed by stacking a first electrode layer, a dielectric layer, and second electrode layer; and a magnetic film loaded inductor disposed over the semiconductor substrate at a position different from the capacitor with respect to the plane of the semiconductor substrate, the magnetic film loaded inductor comprising a magnetic film made of a magnetic material, and a coil pattern made of a conductor, wherein the magnetic film is disposed below, above, or on both sides of the coil pattern with an interlayer insulation film therebetween and in the proximity of the coil pattern, wherein a distance between the coil pattern and the magnetic film is adjusted by a thickness of the interlayer insulation film, and wherein the magnetic film is disposed on an interlayer insulation film which has a thickness to provide an appropriate distance between the magnetic film and the semiconductor substrate.

18. The composite module according to claim 17, wherein the coil pattern is made of a coil pattern having a multilayer structure formed by stacking multiple coil patterns.

19. The composite module according to claim 17, further comprising:

a first wiring layer formed over the semiconductor substrate, wherein a portion of the first wiring layer under the magnetic film and the lower position of the coil pattern is removed.

20. A composite module having a capacitor, which is formed by stacking a first electrode layer, a dielectric layer and a second electrode layer, and a magnetic film loaded inductor provided with a magnetic film made of a magnetic material on a semiconductor substrate, wherein:

the magnetic film loaded inductor is provided with:

a coil pattern made of a conductor, and a magnetic film made of a magnetic material which is disposed below, above or both sides of the coil pattern via an interlayer insulation film and in the proximity of the coil pattern; and the magnetic film loaded inductor is disposed at a position above the capacitor and corresponding to the capacitor; and a distance between the coil pattern and the magnetic film is adjusted by a thickness of the interlayer insulation film.

21. The composite module according to claim 20, wherein the coil pattern is a coil pattern having a multilayer structure formed by stacking multiple coil patterns.

* * * * *